US012795951B2

(12) United States Patent
Choi et al.

(10) Patent No.: US 12,795,951 B2
(45) Date of Patent: Nov. 10, 2026

(54) SEMICONDUCTOR DEVICE, MANUFACTURING METHOD OF THE SAME, AND ELECTRONIC SYSTEM INCLUDING SEMICONDUCTOR DEVICE

(71) Applicant: SAMSUNG ELECTRONICS CO., LTD., Suwon-si (KR)

(72) Inventors: Moorym Choi, Suwon-si (KR); Sunil Shim, Suwon-si (KR); Seungwoo Paek, Suwon-si (KR); Jimin Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 533 days.

(21) Appl. No.: 18/370,949

(22) Filed: Sep. 21, 2023

(65) Prior Publication Data

US 2024/0349520 A1 Oct. 17, 2024

(30) Foreign Application Priority Data

Apr. 11, 2023 (KR) ........................ 10-2023-0047822

(51) Int. Cl.
*H10B 80/00* (2026.01)
*H10B 41/27* (2023.01)
(Continued)

(52) U.S. Cl.
CPC ............. *H10B 80/00* (2023.02); *H10B 41/27* (2023.02); *H10B 43/27* (2023.02); *H10W 72/952* (2026.01); *H10W 90/00* (2026.01); *H10W 72/07554* (2026.01); *H10W 72/926* (2026.01); *H10W 72/941* (2026.01);
(Continued)

(58) Field of Classification Search
None
See application file for complete search history.

(56) References Cited

U.S. PATENT DOCUMENTS 8,971,118 B2 3/2015 Jin et al.
11,488,667 B2 11/2022 Kim et al.
(Continued)

FOREIGN PATENT DOCUMENTS

KR 10-2021-0092359 A 7/2021
KR 10-2021-0110995 A 9/2021
KR 10-2022-0068540 A 5/2022

*Primary Examiner* — Bilkis Jahan
(74) *Attorney, Agent, or Firm* — Muir Patent Law, PLLC

(57) ABSTRACT

A semiconductor device includes bonded circuit and cell regions. The cell region includes a substrate, a base memory portion, and a bonding memory portion. Here, base memory portion includes a first gate stacking structure on the substrate and having first and second surfaces, a first channel structure penetrating the first gate stacking structure, and a base bonding pad on the second surface and connected to the first channel structure. The bonding memory portion includes a second gate stacking structure having a third surface bonded to the base memory portion and a fourth surface bonded to the circuit region, a second channel structure penetrating the second gate stacking structure, a first bonding pad connected to the second channel structure in the third surface and bonded to the base bonding pad, and a second bonding pad connected to the second channel structure in the fourth surface and bonded to the circuit region.

17 Claims, 21 Drawing Sheets

(51) Int. Cl.

| | |
|---|---|
| ***H10B 43/27*** | (2023.01) |
| ***H10W 90/00*** | (2026.01) |
| *H10W 72/00* | (2026.01) |
| *H10W 72/90* | (2026.01) |
| *H10W 80/00* | (2026.01) |

(52) U.S. Cl.
CPC ........ *H10W 72/944* (2026.01); *H10W 72/951* (2026.01); *H10W 80/327* (2026.01); *H10W 90/752* (2026.01); *H10W 90/754* (2026.01); *H10W 90/792* (2026.01)

(56) References Cited

U.S. PATENT DOCUMENTS

| | | | | |
|---|---|---|---|---|
| 11,641,738 | B2 | 5/2023 | Yang et al. | |
| 2016/0225785 | A1* | 8/2016 | Kim | H10B 43/10 |
| 2018/0053768 | A1* | 2/2018 | Kim | G11C 16/08 |
| 2020/0227397 | A1 | 7/2020 | Yada | |
| 2020/0381408 | A1 | 12/2020 | Liu et al. | |
| 2021/0057444 | A1* | 2/2021 | Park | H10B 41/10 |
| 2021/0217760 | A1 | 7/2021 | Yang et al. | |
| 2021/0225867 | A1 | 7/2021 | Yang et al. | |
| 2021/0272631 | A1 | 9/2021 | Kim et al. | |
| 2021/0399005 | A1* | 12/2021 | Lee | H10B 41/27 |
| 2022/0028846 | A1 | 1/2022 | Alsmeier et al. | |
| 2022/0157754 | A1 | 5/2022 | Park et al. | |

* cited by examiner

10

SEMICONDUCTOR DEVICE, MANUFACTURING METHOD OF THE SAME, AND ELECTRONIC SYSTEM INCLUDING SEMICONDUCTOR DEVICE

CROSS-REFERENCE TO RELATED APPLICATION

This application claims priority to and the benefit of Korean Patent Application No. 10-2023-0047822, filed in the Korean Intellectual Property Office on Apr. 11, 2023, the entire contents of which are incorporated herein by reference.

BACKGROUND

1. Field

The present disclosure relates to a semiconductor device, a manufacturing method of the semiconductor device, and an electronic system including the semiconductor device.

2. Description of the Related Art

In an electronic system implementing data storage, high-capacity data may be stored in a semiconductor device. Accordingly, methods to increase a data storage capacity of a semiconductor device are being researched. For example, as one of the methods for increasing the data storage capacity of the semiconductor device, a semiconductor device including three-dimensionally arranged memory cells instead of two-dimensionally arranged memory cells has been proposed.

SUMMARY

A semiconductor device according to an embodiment includes a circuit region and a cell region bonded to the circuit region. The cell region may include a substrate, a base memory portion, and a bonding memory portion. Here, base memory portion includes a first gate stacking structure on the substrate and having one surface facing the substrate and the other surface opposite to the substrate, a first channel structure penetrating the first gate stacking structure, and a base bonding pad disposed on the other surface of the first gate stacking structure and connected to the first channel structure. The bonding memory portion includes a second gate stacking structure having a first surface bonded to the base memory portion and a second surface bonded to the circuit region, a second channel structure penetrating the second gate stacking structure, a first bonding pad connected to the second channel structure in the first surface and bonded to the base bonding pad, and a second bonding pad connected to the second channel structure in the second surface and bonded to the circuit region.

A manufacturing method of a semiconductor device according to an embodiment includes forming of a memory substrate, forming of a cell region, and bonding of the cell region to a circuit region. In the forming of the memory substrate, a base memory substrate is manufactured by forming a base memory portion on a substrate and a bonding memory substrate is manufactured by forming a bonding memory portion on a carrier substrate. In the forming of the cell region, a first surface of the bonding memory portion of the bonding memory substrate is bonded to the base memory portion of the base memory substrate and the carrier substrate is removed. In the bonding of the cell region to a circuit region, a second surface of the bonding memory portion of the cell region is bonded to the circuit region.

An electronic system according to an embodiment includes a main substrate, the semiconductor device on the main substrate, and a controller that is electrically connected with the semiconductor device on the main substrate.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, referring to FIG. 1 to FIG. 3 and FIG. 4A to FIG. 4G, a semiconductor device and a manufacturing method thereof according to an embodiment will be described in detail.

Figure 1:
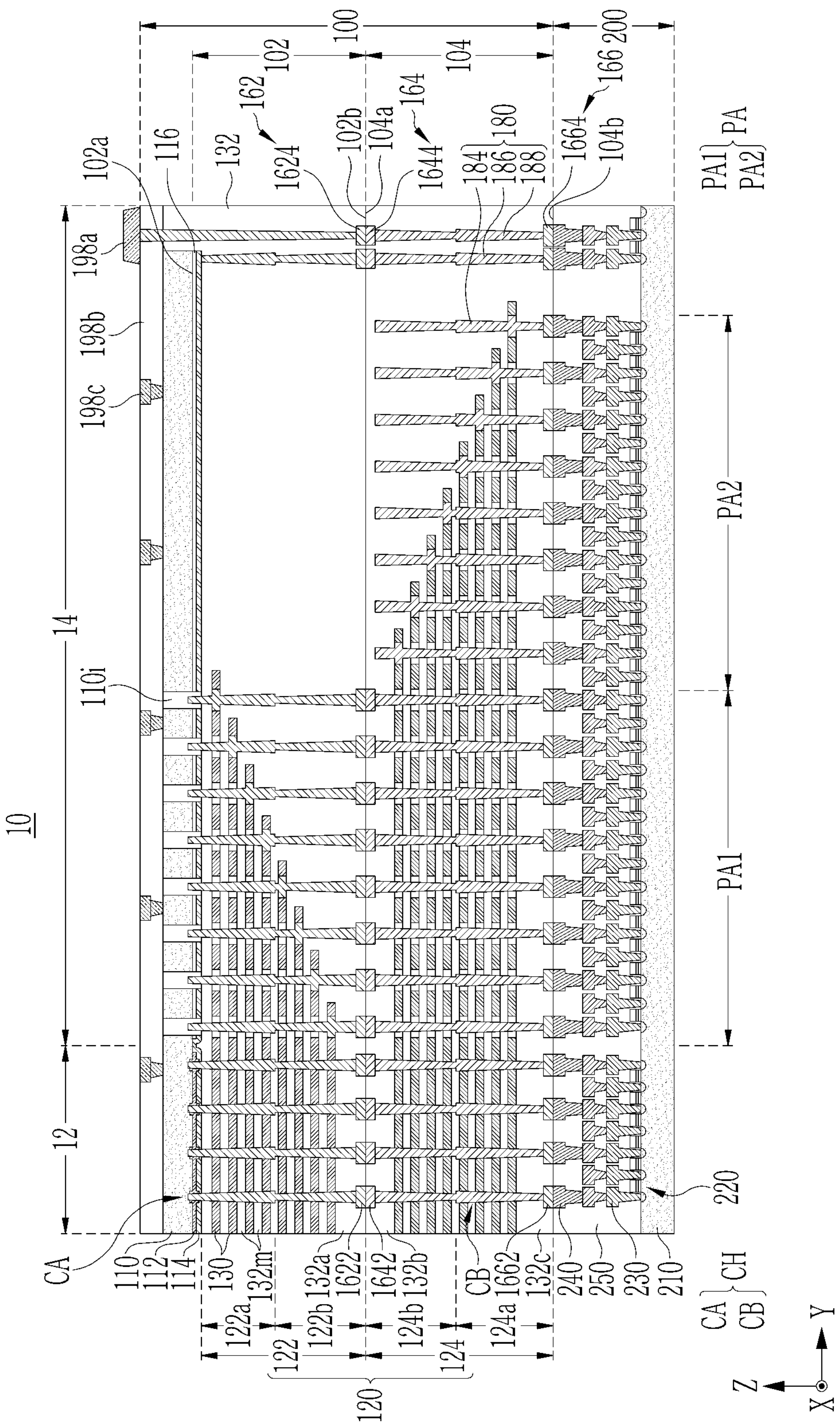
FIG. 1 is a schematic cross-sectional view of a semiconductor device according to an embodiment.
Figure 2:
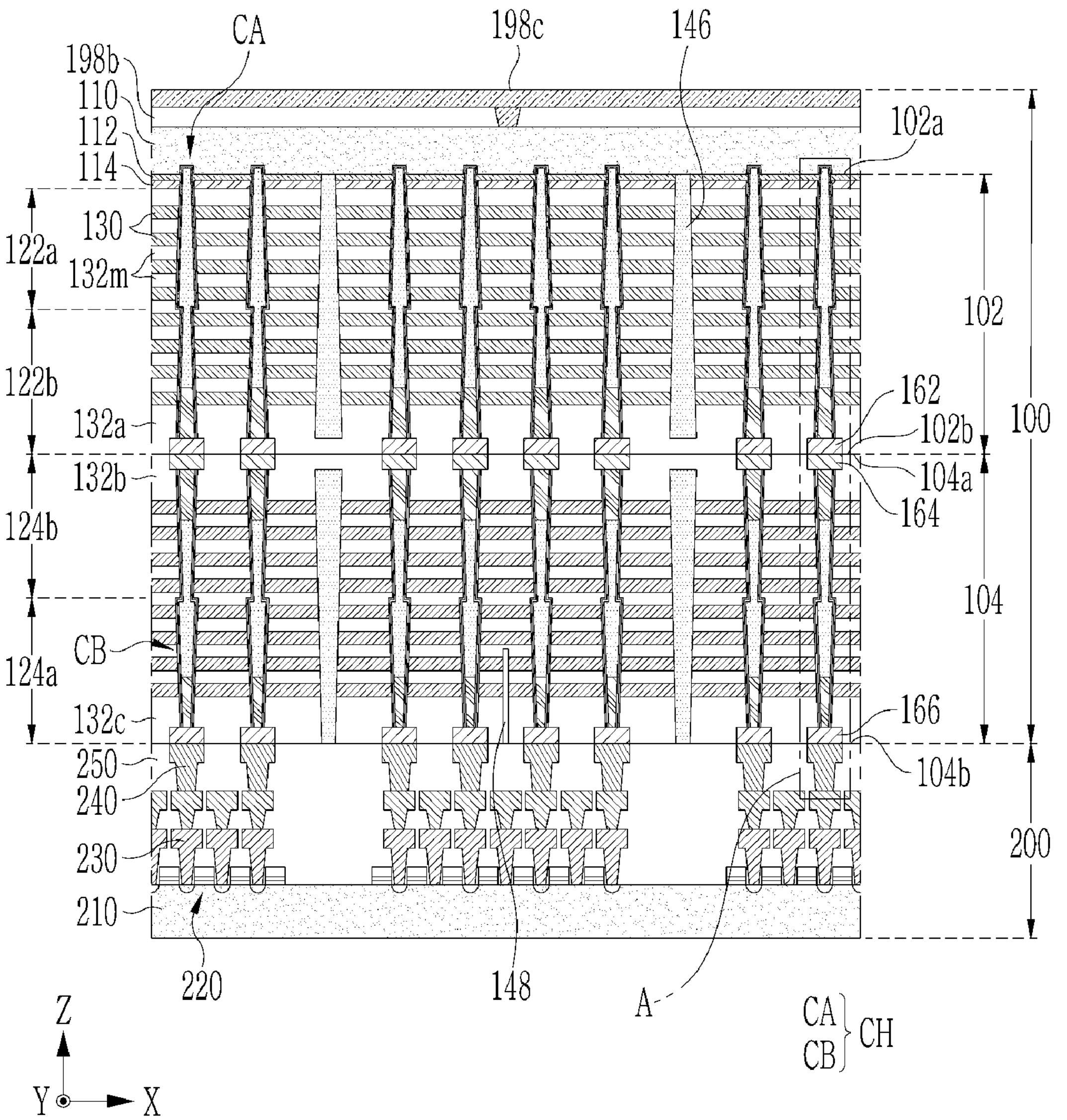
FIG. 2 is a cross-sectional view of a cell array region of the semiconductor device shown in FIG. 1.

FIG. 1 is a schematic cross-sectional view of a semiconductor device according to an embodiment. FIG. 2 is a cross-sectional view of a cell array region of the semiconductor device shown in FIG. 1, and FIG. 3 is an enlarged cross-sectional view of the region A of FIG. 2.

Figure 3:
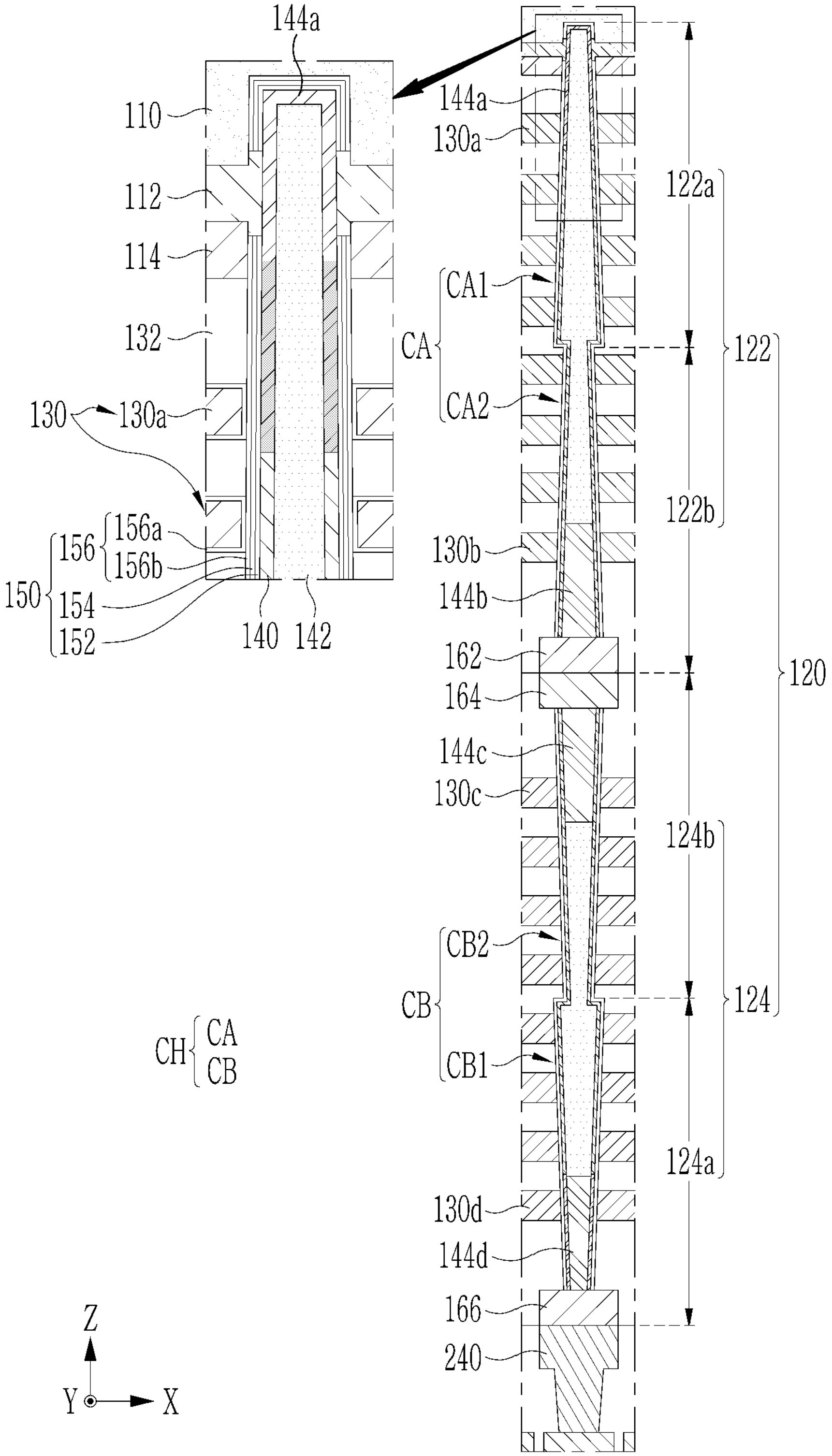
FIG. 3 is an enlarged cross-sectional view of the region A of FIG. 2.

Referring to FIG. 1 to FIG. 3, the semiconductor device 10 according to the embodiment may include a cell region 100 where a memory cell structure is provided, and a circuit region 200 where a peripheral circuit structure controlling an operation of the memory cell structure.

In this case, the cell region 100 and the circuit region 200 may have a chip-to-chip (C2C) structure such that they may be bonded by a wafer bonding method (e.g., hybrid bonding). The cell region 100 includes a base memory portion 102 and a bonding memory portion 104 bonded to the base memory portion 102 such that they may include a plurality of memory portions 102 and 104. The plurality of memory portions 102 and 104 may be bonded to each other by the wafer-bonding method (e.g., hybrid bonding). For example, a lower chip that corresponds to the circuit region 200 including a first substrate 210 is manufactured, and an upper chip that corresponds to the cell region 100 including the base memory portion and the bonding memory portion 104 bonded thereto is manufactured. Then, the semiconductor device 10 can be manufactured by bonding the lower chip and the upper chip. A detailed manufacturing method of the semiconductor device 10 will be described in detail later with reference to FIG. 4A to FIG. 4G.

The circuit region 200 may include a first substrate 210, a circuit element 220 and a first wiring portion 230 formed on the first substrate 210, and a first bonding structure 240 disposed on a surface facing the cell region 100. In addition, the circuit region 200 may further include an insulation layer 250 that covers the first substrate 210, the circuit element 220, the first wiring portion 230, or the like.

The first substrate 210 may be a semiconductor substrate including a semiconductor material. For example, the first substrate 210 may be a semiconductor substrate formed of a semiconductor material or may be a semiconductor substrate in which a semiconductor layer is formed on a base substrate. For example, the first substrate 210 may be formed of single crystal or polysilicon, epitaxial silicon, germanium, silicon-germanium, silicon-on-insulator (SOI), or germanium-on-insulator (GOI), or the like.

The circuit element 220 formed on the first substrate 210 may include any of various circuit elements that control the operation of the memory cell structure provided in the cell region 100. For example, the circuit element 220 may form a peripheral circuit structure such as a decoder circuit (reference numeral 1110 in FIG. 9), a page buffer (reference numeral 1120 in FIG. 9), and a logic circuit (reference numeral 1130 in FIG. 9). The circuit element 220 may include, e.g., a transistor. For example, the circuit element 220 may include not only active elements, e.g., transistors, but also passive elements, e.g., capacitors, registers, inductors, or the like.

The first wiring portion 230 disposed on the first substrate 210 may electrically connect the circuit element 220 and the first bonding structure 240. The first wiring portion 230 may include one wiring layer or a plurality of wiring layers stacked with an insulation layer 250 therebetween and connected in a predetermined path through a contact plug or the like. The wiring layer or the contact via may include a conductive material, and the insulation layer 250 may include an insulating material, e.g., a silicon oxide or a silicon nitride. The insulation layer 250 may include one or a plurality of insulation layers.

The first bonding structure 240 is disposed on the first wiring portion 230 and may be electrically connected to the first wiring portion 230. The first bonding structure 240 may be exposed toward the cell region 100 at one surface of the insulation layer 250 bonded to the cell region 100. That is, the first bonding structure 240 and the insulation layer 250 are disposed on one surface of the circuit region 200 bonded to the cell region 100. The first bonding structure 240 may be bonded to a second bonding structure (in further detail, a second bonding pad 166) of the cell region 100 and provide an electrical connection path between the circuit region 200 and the cell region 100.

For example, a second bonding pad 166, which is a second bonding structure, may include a second channel bonding pad 1662 and a second wiring bonding pad 1664. The second channel bonding pad 1662 may be connected to a channel structure CH. The second wiring bonding pad 1664 may be connected to wiring such as a gate contact portion 184, a source contact portion 186, and an input and output connection wire 188. The first bonding structure 240 may include a plurality of bonding structures respectively bonded to the second channel bonding pad 1662 and the second wiring bonding pad 1664.

The cell region 100 bonded to the circuit region 200 may include a cell array region 12 and a connection region 14. In the cell array region 12, a gate stacking structure 120 and a channel structure CH may be formed on the second substrate 110. The connection region 14 may be disposed around the cell array region 12. A structure or wiring for connecting the gate stacking structure 120 and/or the channel structure CH formed in the cell array region 12 to the circuit region 200 or an external circuit may be disposed in the connection region 14. For example, a pad area PA may be disposed in the connection region 14.

The second substrate 110 included in the cell region 100 may be a semiconductor substrate including a semiconductor material. For example, the second substrate 110 may be a semiconductor substrate formed of a semiconductor material or may be a semiconductor substrate in which a semiconductor layer is formed on a base substrate. For example, the second substrate 110 may be formed of single crystal, polysilicon, or epitaxial silicon, germanium, or silicon-germanium, silicon-on-insulator, or germanium-on-insulator. Here, the semiconductor layer included in the second substrate 110 may be doped with a p-type or n-type impurity or dopant. For example, an n-type impurity (e.g., phosphorus (P), arsenic (As), etc.) may be doped. In the second substrate 110, a substrate insulating portion 110*i* may be provided in an area through which the gate contact portion 184 passes.

The semiconductor device 10 according to an embodiment may include an input and output pad 198*a* and an input and output connection wiring 188 electrically connected thereto. The input and output connection wiring 188 will be described in more detail later. The input and output pad 198*a*, for example, may be disposed on the insulation layer 198*b* covering an outer surface of the second substrate 110, which is opposite to a surface on which the plurality of memory portions 102 and 104 are disposed. Depending on embodiments, a separate input and output pad electrically connected to the circuit region 200 may be provided.

Depending on embodiments, a source connection pattern 198*c* connected to the second substrate 110 through the insulation layer 198*b* may be provided on the outer surface of the second substrate 110. The source connection pattern 198*c* may be formed of a conductive material with lower resistivity than the second substrate 110. For example, the source connection pattern 198*c* may include a metal material, e.g., tungsten (W), copper (Cu), aluminum (Al), or the like.

When a current flows through the second substrate 110, which functions as a common source line, voltage drop or noise may occur due to the resistance of the second substrate 110, and the operation of the memory cell (e.g., read operation) may not be performed smoothly. Accordingly, a source connection pattern 198*c* connected to the second substrate 110 and having lower resistance than the second substrate 110 is further provided to provide a low-resistance electrical connection path. The source connection pattern 198*c* may have any of various shapes that can provide an electrical connection path.

The cell region 100 may include a base memory portion 102 formed on the second substrate 110 and a bonding memory portion 104 bonded thereto. In further detail, the base memory portion 102 may include a first gate stacking structure 122 and a first channel structure CA formed on the second substrate 110, and a base bonding pad 162 connected to the first channel structure CA. The bonding memory portion 104 may include a second gate stacking structure 124, a second channel structure CB, a first bonding pad 164, and a second bonding pad 166. At least some of first bonding pads 164 and second bonding pads 166 are connected to the second channel structure CB. The first bonding pad 164 and the second bonding pad 166 may be connected to a base bonding pad 162 and the first bonding structure 240, respectively. This will be described in further detail.

The base memory portion 102 formed on the second substrate 110 may refer to a memory portion formed by performing, e.g., deposition and coating on the second substrate 110. The base memory portion 102 may include a first gate stacking structure 122, a first channel structure CA, and a base bonding pad 162.

The first gate stacking structure 122 may be formed on the second substrate 110 and have one surface 102*a* facing the second substrate 110 and the other surface 102*b* opposite the second substrate 110. The first channel structure CA may penetrate the first gate stacking structure 122. The base bonding pad 162 may be disposed on the other surface 102*b* and some of the base bonding pad 162 may be connected to the first channel structure CA.

In an embodiment, horizontal conductive layers 112 and 114 may be provided between the second substrate 110 and the first gate stacking structure 122 in the cell array region 12. The horizontal conductive layers 112 and 114 may serve to electrically connect the channel structure CH and the second substrate 110. For example, the horizontal conductive layers 112 and 114 may include a first horizontal conductive layer 112 disposed on one surface of the second substrate 110, and may further include a second horizontal conductive layer 114 disposed on the first horizontal conductive layer 112. In some regions of the connection region 14, a horizontal insulation layer 116 may be provided between the second substrate 110 and the first gate stacking structure 122 instead of the first horizontal conductive layer 112. In a manufacturing process, a part of the horizontal insulation layer 116 may be replaced with the first horizontal conductive layer 112, and another part of the horizontal insulation layer 116 disposed in the connection region 14 may remain in the connection region 14.

The first horizontal conductive layer 112 may function as a part of the common source line of the semiconductor device 10. For example, the first horizontal conductive layer 112 may serve as a common source line with the second substrate 110. As shown in the enlarge view of FIG. 3, the channel structure CH is extended to reach the second substrate 110 through the horizontal conductive layers 112 and 114, and a gate dielectric layer 150 is removed at a portion where the first horizontal conductive layer 112 is located, and thus the first horizontal conductive layer 112 can be directly connected with a channel layer 140 in a circumference of the channel layer 140.

The first and second horizontal conductive layers 112 and 114 may include a semiconductor material (e.g., polysilicon). For example, the first horizontal conductive layer 112 may be a polysilicon layer doped with impurity or dopant, and the second horizontal conductive layer 114 may be a polysilicon layer doped with impurity or a dopant or a layer including impurity or a dopant diffused from the first horizontal conductive layer 112. However, the embodiment is not limited thereto, and the second horizontal conductive layer 114 may be formed of an insulating material. Alternatively, the second horizontal conductive layer 114 may not be provided separately.

The first gate stacking structure 122 may include a plurality of cell insulation layers 132 and a plurality of gate electrodes 130 alternately stacked with each other.

The cell insulation layer 132 may include an interlayer insulation layer 132*m* disposed between two adjacent gate electrodes 130 in the first gate stacking structure 122, and a base insulation layer 132*a* disposed on the other surface 102*b* of the base memory portion 102 in the first gate stacking structure 122. For simple illustration, in FIG. 2, it is exemplarily illustrated that the cell insulation layer 132 is provided as one without a boundary in a portion where a source contact portion 186, an input and output connection wiring 188, and the like are provided in the connection region 14. However, the cell insulation layer 132 disposed in the connection region 14 may have any of various structures including one or a plurality of insulation layers.

The gate electrode 130 may include any of various conductive materials. For example, the gate electrode 130 may include a metal material, e.g., tungsten (W), copper (Cu), aluminum (Al), polysilicon, a metal nitride (e.g., titanium nitride (TiN), tantalum nitride (TaN), etc.), or a combination thereof. As shown in an enlarged view of FIG. 3, a portion of a blocking layer 156 formed of an insulating material (e.g., a first blocking layer 156*a*) may be disposed outside the gate electrode 130. The cell insulation layer 132 may include any of various insulating materials. For example, the cell insulation layer 132 may include a silicon oxide, a silicon nitride, a silicon oxynitride, a low dielectric constant material having a smaller dielectric constant than silicon oxide, or a combination thereof.

A first channel structure CA may extend in a crossing direction (Z-axis direction of the drawing or for example, a vertical direction) of the second substrate 110 through the first gate stacking structure 122. The first channel structure CA may have a columnar shape. For example, when the first channel structure CA is viewed on the cross-section, it may have an inclined side surface such that a width becomes narrower as it approaches the second substrate 110 according to an aspect ratio.

The first channel structure CA may include a channel layer 140 and a gate dielectric layer 150 disposed on the channel layer 140 between the gate electrode 130 and the channel layer 140. The first channel structure CA may further include a core insulation layer 142 disposed inside (e.g., a central region) of the channel layer 140, but as another example, the core insulation layer 142 may not be provided. The gate dielectric layer 150 disposed between the gate electrode 130 and the channel layer 140 may include a tunneling layer 152, a charge storage layer 154, and a blocking layer 156 sequentially formed on the channel layer 140. In an embodiment, the first channel structure CA may include a doping region 144*a* and/or a channel pad 144*b* connected to the channel layer 140. Here, the doping region 144*a* and the channel pad 144*b* may form a part of a gate induced drain leakage (GIDL) transistor.

The channel layer 140 may include a semiconductor material, e.g., polysilicon. The core insulation layer 142 may include any of various insulating materials. For example, the core insulation layer 142 may include a silicon oxide, a silicon nitride, a silicon oxynitride, or a combination thereof.

The tunneling layer 152 may include an insulating material (e.g., silicon oxide, silicon oxide, etc.) capable of charge tunneling. A charge storage layer 154 is used as a data storage region, and the charge storage layer 154 may include polysilicon, silicon nitride, or the like. The blocking layer 156 may include an insulating material that can prevent an undesirable charge inflow into the gate electrode 130. For example, the blocking layer 156 may include a silicon oxide, a silicon nitride, a silicon oxynitride, a high dielectric constant material having a higher dielectric constant than silicon oxide, or a combination thereof.

In an embodiment, the blocking layer 156 may include a first blocking layer 156*a* including a portion extending horizontally along the gate electrode 130 and a second blocking layer 156*b* extending vertically between the first blocking layer 156*a* and the charge storage layer 154. However, the material and stacking structure of the channel layer 140, the core insulation layer 142, and the gate dielectric layer 150 may be variously modified.

In an embodiment, the base memory portion 102 may include a GIDL transistor. The doping region 144*a* and/or the channel pad 144*b* included in the first channel structure CA may form a GIDL region constituting a GIDL transistor.

In further detail, the first channel structure CA may include the doping region 144*a* on one surface 102*a* of the base memory portion 102, and the first channel structure CA may include the channel pad 144*b* on the other surface 102*b* of the base memory portion 102. In this case, the doping region 144*a* may overlap with at least one of the gate electrodes 130 included in the first gate stacking structure 122 (e.g., a first erase gate electrode 130*a* adjacent to the second substrate 110) in a horizontal direction. In addition, the channel pad 144*b* may overlap at least one of the gate electrodes 130 included in the first gate stacking structure 122 (e.g., a second erase gate electrode 130*b* adjacent to the other surface 102*b*) in the horizontal direction.

The doping region 144*a* may include a semiconductor layer doped with p-type or n-type impurity or dopant, and for example, may be formed of a semiconductor layer (e.g., polysilicon) doped with n-type impurity or dopant. The doping region 144*a* may be a region formed by doping a portion of the channel layer 140 with impurity or dopant. In further detail, the doping region 144*a* may be formed by doping impurity or dopant in a portion of the channel layer 140 overlapping at least one gate electrode 130 adjacent to the second substrate 110. Accordingly, the doping region 144*a* may be configured as a layer continuously connected to the channel layer 140. A manufacturing process may be simplified by forming the GIDL region with the doping region 144*a* without performing a process of forming the channel pad 144*b* on the one surface 102*a* (e.g., side) of the base memory portion 102 adjacent to the second substrate 110. However, the embodiment is not limited thereto, and the doping region 144*a* may have the same or similar structure as the channel pad 144*b*.

The channel pad 144*b* may include a semiconductor layer doped with p-type or n-type impurity or dopant, and for example, may be composed of a semiconductor layer (e.g., polysilicon) doped with n-type impurity or dopant. The channel pad 144*b* may have a shape extending in a crossing direction (Z-axis direction of the drawing or e.g., a vertical direction) of the second substrate 110 on the core insulation layer 142, the channel layer 140, and/or the gate dielectric layer 150.

The GIDL transistor or GIDL region may be a transistor or region that performs an erase operation for erasing information stored in a memory cell transistor using a GIDL phenomenon.

During an erase operation of the semiconductor device 10 according to an embodiment, an erase voltage may be applied to a bit line, and a voltage smaller than the erase voltage may be applied to first or second erase gate electrodes 130*a* and 130*b*, which form the GIDL transistor. In this case, a depletion region may be formed where the first or second erase gate electrodes 130*a* and 130*b* and the drain region overlap, and electron-hole pairs may be formed in the depletion region. Among the electron-hole pairs formed in the depletion region, electrons move toward a drain region by band-to-band tunneling (BTBT), and holes move to a channel region to increase channel voltage thereby enabling erase operation.

In an embodiment, the first gate stacking structure 122 may include a plurality of stacking structures 122*a* and 122*b* sequentially stacked on the second substrate 110, and the first channel structure CA may include a plurality of channel structures CA1 and CA2 penetrating the plurality of stacking structures 122*a* and 122*b*, respectively.

A plurality of channel structures CA1 and CA2 that form one first channel structure CA may have a form connected to each other. When the plurality of channel structures CA1 and CA2 are viewed on the cross-section, they may have inclined side surfaces such that a width becomes narrower as it approaches the second substrate 110 according to an aspect ratio such that a bent portion may be provided due to a difference in width at a connection portion of the plurality of channel structures CA1 and CA2. As another example, the plurality of channel structures CA1 and CA2 may have inclined side surfaces continuously connected without bending. In FIG. 3, it is exemplarily illustrated that the gate dielectric layer 150, the channel layer 140, and the core insulation layer 142 of the plurality of channel structures CA1 and CA2 are mutually extended to have an integral structure. However, the embodiment is not limited thereto, and the gate dielectric layer 150, the channel layer 140, and the core insulation layer 142 of the plurality of channel structures CA1 and CA2 may be separately formed and electrically connected to each other. In addition, a separate channel pad may be additionally provided at a connection portion of the plurality of channel structures CA1 and CA2.

As described, when the plurality of stacking structures 122*a* and 122*b* and the plurality of channel structures CA1 and CA2 that respectively penetrate the plurality of stacking structures 122*a* and 122*b* are included, a number of gate electrodes 130 included in the base memory portion 102 can be increased, and thus a number of memory cells can be maximized. An embodiment is not limited to the number of the plurality of stacking structures 122*a* and 122*b* or the plurality of channel structures CA1 and CA2, e.g., only one first gate stacking structure 122 may be provided, and/or one first channel structure CA may be provided.

In an embodiment, the first gate stacking structure 122 may be partitioned in plurality on a plane by a separation structure 146 extended in a crossing direction (Z-axis direction of the drawing or for example, a vertical direction) of the second substrate 110 and penetrating the first gate stacking structure 122. On the plane, the separation structure 146 extends in a first direction (Y-axis direction of the drawing) and may be provided in plurality so as to be spaced apart from each other at predetermined intervals in a second direction (X-axis direction of the drawing) crossing the first direction. For example, the separation structure 146 may extend to penetrate the first gate stacking structure 122 to the second substrate 110.

On the plane, a plurality of first gate stacking structures 122 each extend in the first direction (Y-axis direction of the drawing) and may be spaced apart from each other at a predetermined interval in the second direction (X-axis direction of the drawing) by the separation structure 146. The first gate stacking structure 122 partitioned by the separation structure 146 may constitute one memory cell block.

For example, the separation structure 146 has an inclined side surface of which a width gradually decreases toward the second substrate 110 due to a high aspect ratio when viewed on the cross-section. A side surface of the separation structure 146 may be vertical to the second substrate 110 or may have a bent portion at a connection portion of the plurality of stacking structures 122*a* and 122*b*. The separation structure 146 may be filled with any of various insulating materials. For example, the separation structure 146 may include an insulating material, e.g., silicon oxide, silicon nitride, or silicon oxynitride.

In an embodiment, a gate electrode 130 and an interlayer insulation layer 132*m* of the plurality of first gate stacking structure 122 may be extended and disposed in the connection region 14 in the first direction (Y-axis direction of the drawing). A first pad region PA1 where the base memory portion 102 and the first gate contact portion 184 are connected to each other may be provided in the connection region 14 of the base memory portion 102.

A plurality of gate electrodes 130 may be sequentially removed from the first pad region PA1 of the base memory portion 102. As an embodiment, in the first pad region PA1, a length of the plurality of gate electrodes 130 may be sequentially increased toward the second substrate 110 in a direction away from the cell array region 12. For example, as illustrated in FIG. 1, a length of the plurality of gate electrodes 130 in the first pad region PA1 in the Y-direction may sequentially increase as a vertical distance (e.g., along the Z direction) from the second substrate 110 decreases. For example, the plurality of the gate electrodes 130 in the first pad region PA1 may have a stair shape descending toward the first substrate 210 in a direction away from the cell array region 12. In this case, the plurality of gate electrodes 130 may have a staircase shape in one direction or a plurality of directions.

Accordingly, the plurality of gate electrodes 130 in the first pad region PA1 may have a form in which a portion to which the gate contact portion 184 is connected is sequentially exposed. In the first pad region PA1, the plurality of gate electrodes 130 may have a shape or profile that can be individually connected to the plurality of gate electrodes 130.

In an embodiment, the gate contact portion 184 provided on the base memory portion 102 in the first pad region PA1 may be electrically connected to the gate electrode 130 provided on the base memory portion 102 through the first gate stacking structure 122 and the like. In the first pad region PA1, the gate contact portion 184 provided in the base memory portion 102 may be electrically connected to a connection gate electrode among the plurality of gate electrodes 130 and insulated from the remaining gate electrodes.

For example, the gate contact portion 184 may be connected to an inner surface of the connection gate electrode while penetrating the connection gate electrode. For example, the gate contact portion 184 may have a connection portion protruding to an inner surface of the connection gate electrode to directly contact the connection gate electrode. In addition, the gate contact portion 184 may be insulated from the remaining gate electrodes with an insulation pattern interposed therebetween. A width of the insulation pattern in a horizontal direction may be greater than a thickness of the remaining gate electrodes in a vertical direction or a thickness direction. Accordingly, it is possible to effectively insulate the remaining gate electrode and the gate contact portion 184. The gate contact portion 184 may include a conductive material, e.g., tungsten copper, aluminum, or the like, and may further include a diffusion barrier layer.

In addition, a source contact portion 186 for connecting horizontal conductive layers 112 and 114 and/or the second substrate 110 and the circuit region 200, and a connection wiring 188 for connecting the input and output pad 198*a* and the circuit region 200 may be positioned in the connection region 14 of the base memory portion 102. Depending on embodiments, a connection wiring connected to a bit line, the gate contact portion 184, the source contact portion 186, and the input and output connection wiring 188 may be further included.

In an embodiment, the source contact portion 186 of the base memory portion 102 penetrates the cell insulation layer 132 to connect the horizontal conductive layers 112 and 114 and/or the second substrate 110 and the base bonding pad 162 (in further detail, a wiring bonding pad 1624). In addition, the input and output connection wiring 188 may connect the input and output pad 198*a* and the base bonding pad 162 (in further detail, a wiring bonding pad 1624) outside the first gate stacking structure 122 or while passing through the first gate stacking structure 122.

The other surface 102*b* of the base memory portion 102 adjacent to the bonding memory portion 104 is a bonding surface with the bonding memory portion 104, and is formed of the base bonding pad 162 and the base insulation layer 132*a* disposed at a periphery of the base bonding pad 162. The base bonding pad 162 may include a channel bonding pad 1622 connected to the first channel structure CA in the cell array region 12 and the wiring bonding pad 1624 connected to wiring in the connection region 14. The wiring bonding pad 1624 may include a plurality of pads each connected to the gate contact portion 184, the source contact portion 186, and the input and output connection wiring 188, respectively.

The bonding memory portion 104 may be bonded to the base memory portion 102. The bonding memory portion 104 may refer to a memory portion formed in a process separate from the base memory portion 102 and bonded to the base memory portion 102.

The bonding memory portion 104 may include the second gate stacking structure 124, the second channel structure CB, the first bonding pad 164, and the second bonding pad 166. The second gate stacking structure 124 may have a first surface bonded to the base memory portion 102 and a second surface bonded to the circuit region 200. The second channel structure CB may penetrate the second gate stacking structure 124. The first bonding pad 164 may be connected to the second channel structure CB and bonded to the base bonding pad 162 in the first surface. The second bonding pad 166 may be connected to the second channel structure CB and bonded to the first bonding structure 240 in the second surface. Here, the second bonding pad 166 may correspond to a second bonding structure bonded to the first bonding structure 240 of the circuit region 200.

In an embodiment, one bonding memory portion 104 is provided such that one surface 104*a* of the bonding memory portion 104 constitutes a first surface bonded to the base memory portion 102, and the other surface 104*b* of the bonding memory portion 104 constitutes a second surface bonded to the circuit region 200. A plurality of bonding memory portions 104 may be provided, which will be discussed later in detail with reference to FIG. 6 and FIG. 7.

The second gate stacking structure 124 may include a plurality of cell insulation layers 132 and a plurality of gate electrodes 130 alternately stacked with each other. The cell insulation layer 132 may include an interlayer insulation layer 132*m* disposed between two adjacent gate electrodes 130 in the second gate stacking structure 124, and a first insulation layer 132*b* and a second insulation layer 132*c* respectively disposed on one surface 104*a* and the other surface 104*b* of the bonding memory portion 104 in the second gate stacking structure 124. With respect to the cell insulation layer 132 and gate electrode 130 included in the second gate stacking structure 124, the description of the cell insulation layer 132 and gate electrode 130 included in the first gate stacking structure 122 may be applied as it is. Accordingly, the detailed description is omitted.

The second channel structure CB that penetrates the second gate stacking structure 124 and extends in a crossing direction (e.g., a vertical direction) of the second substrate 110 (Z-axis direction of the drawing) may be formed. The second channel structure CB may have a columnar shape. For example, when viewed on the cross-section, the second channel structure CB may have an inclined side surface such that a width becomes narrower as it approaches the circuit region 200 according to the aspect ratio.

The second channel structure CB may include the channel layer 140 and the gate dielectric layer 150 disposed on the channel layer 140 between the gate electrode 130 and the channel layer 140. The second channel structure CB may further include the core insulation layer 142 disposed inside (e.g., a central region) of the channel layer 140, but in another example, the core insulation layer 142 may not be provided. The gate dielectric layer 150 disposed between the gate electrode 130 and the channel layer 140 may include the tunneling layer 152, the charge storage layer 154 and the blocking layer 156 sequentially formed on the channel layer 140. In an embodiment, the second channel structure CB may include first and second channel pads 144*c* and 144*d* connected to the channel layer 140. Here, the first and second channel pads 144*c* and 144*d* may form a part of a GIDL transistor.

Descriptions of the first channel structure CA including the channel layer 140 and the gate dielectric layer 150 may also be applied to the second channel structure CB including the channel layer 140 and the gate dielectric layer 150. However, since the second channel structure CB does not include a portion corresponding to the doping region 144*a*, the description of the doping region 144*a* of the first channel structure CA does not apply to the second channel structure CB. In addition, since the bonding memory portion 104 is not provided with the horizontal conductive layers 112 and 114, the description related to the horizontal conductive layers 112 and 114 does not apply to the second channel structure CB.

In an embodiment, the bonding memory portion 104 may include a GIDL transistor. The first channel pad 144*c* and/or the second channel pad 144*d* included in the second channel structure CB may form a GIDL region constituting a GIDL transistor.

In further detail, the second channel structure CB may include the first channel pad 144*c* on one surface 104*a* of the bonding memory portion 104, and the second channel structure CB may include the second channel pad 144*d* on the other surface 104*b* of the bonding memory portion 104. In this case, the first channel pad 144*c* may overlap with at least one of the gate electrodes 130 included in the second gate stacking structure 124 (e.g., a third erase gate electrode 130*c* adjacent to one surface 104*a*) in a horizontal direction. In addition, the second channel pad 144*d* may overlap with at least one of the gate electrodes 130 included in the second gate stacking structure 124 (e.g., a fourth cancellation gate electrode 130*d* adjacent to the other surface 104*b*) in the horizontal direction.

The first channel pad 144*c* and/or the second channel pad 144*d* may include a semiconductor layer doped with p-type or n-type impurity or dopant, and for example, may be composed of a semiconductor layer (e.g., polysilicon) doped with n-type impurity or dopant. The first channel pad 144*c* and/or the second channel pad 144*d* may have a shape that extends in a crossing direction (Z-axis direction of the drawing or for example, a vertical direction of the second substrate 110) on the core insulation layer 142, the channel layer 140 and/or the gate dielectric layer 150.

In an embodiment, the second gate stacking structure 124 may include a plurality of stacking structures 124*a* and 124*b* sequentially stacked, and the second channel structure CB may include a plurality of channel structures CB1 and CB2 that penetrate the plurality of stacking structures 124*a* and 124*b*. The description of the plurality of channel structures CA1 and CA2 may be applied as it is to the plurality of channel structures CB1 and CB2.

The embodiment is not limited to a number of stacking structures 124*a* and 124*b* or channel structures CB1 and CB2. In addition, one second gate stacking structure 124 may be provided, and/or one second channel structure CB may be provided.

In an embodiment, the second gate stacking structure 124 extends in a crossing direction (Z-axis direction of the drawing or for example, vertical) of the second substrate 110 and is divided in plurality on a plane by a separation structure 146 penetrating the second gate stacking structure 124. In addition, a partial separation region 148 may be formed adjacent to the circuit region 200 in the second gate stacking structure 124. On the plane, the separation structure 146 and/or partial separation region 148 extends in the first direction (Y-axis direction of the drawing) and may be provided in plurality so as to be spaced apart from each other at predetermined intervals in the second direction (X-axis direction of the drawing) that intersects the first direction.

For example, the separation structure 146 may pass through the second gate stacking structure 124 and extend up to the surface 104*b*, and the partial separation region 148 may separate one or a portion of the plurality of gate electrodes 130 from each other. The partial separation region 148 may be disposed between the separation structures 146.

For example, the separation structure 146 has an inclined side surface of which a width gradually decreases toward the other surface 104*b* due to a high aspect ratio on the cross-section. A side surface of the separation structure 146 may be vertical to the second substrate 110 or may have a bent portion at a connection portion of the plurality of stacking structures 124*a* and 124*b*.

The separation structure 146 or the partial separation region 148 may be filled with any of various insulating materials. For example, the separation structure 146 or the partial separation region 148 may include an insulating material, e.g., silicon oxide, silicon nitride, or silicon oxynitride.

In an embodiment, gate electrodes 130 and interlayer insulation layers 132*m* of the plurality of second gate stacking structure 124 may be extended in the first direction (Y-axis direction of the drawing) and disposed in the connection region 14. A second pad region PA2 where the bonding memory portion 104 and the first gate contact portion 184 are connected may be provided in the connection region 14 of the bonding memory portion 104.

A plurality of gate electrodes 130 may be sequentially removed from the second pad region PA2 of the bonding memory portion 104. As an embodiment, in the second pad region PA2, a length of the plurality of gate electrodes 130 may sequentially increase toward the circuit region 200 in a direction away from the cell array region 12. For example, as illustrated in FIG. 1, a length of the plurality of gate electrodes 130 in the second pad region PA2 in the Y-direction may sequentially increase as a vertical distance (e.g., along the Z direction) from the circuit region 200 decreases. For example, in the second pad region PA2, the plurality of gate electrodes 130 may have a stair shape descending in a direction oriented away from the cell array region 12 toward the circuit region 200. For example, as illustrated in FIG. 1, the stair shape of the plurality of gate electrodes 130 in the second pads region PA2 may be inverted in the Z-direction with respect to the stair shape of the plurality of gate electrodes 130 in the first pad region PA1. In this case, the plurality of gate electrodes 130 in the second pad region PA2 may have a staircase shape in one direction or a plurality of directions.

Accordingly, a portion to which the gate contact portion 184 is connected in the plurality of gate electrodes 130 in the second pad region PA2 may be sequentially exposed. In the second pad region PA2, the plurality of gate electrodes 130 may have a shape or profile that can be individually connected to the plurality of gate electrodes 130.

In an embodiment, the gate contact portion 184 provided on the bonding memory portion 104 in the second pad region PA2 may be electrically connected to the gate electrode 130 provided on the bonding memory portion 104 through the second gate stacking structure 124 and the like. In the second pad region PA2, the gate contact portion 184 provided in the bonding memory portion 104 may be electrically connected to a connection gate electrode among the plurality of gate electrodes 130 and insulated from the remaining gate electrodes.

In an embodiment, the first pad region PA1 of the bonding memory portion 104 may further include a gate contact portion 184 connecting the gate contact portion 184 provided in the first pad region PA1 of the base memory portion 102 to the circuit region 200. For example, the gate contact portion 184 of the bonding memory portion 104 may pass through the second gate stacking structure 124 and connect the first bonding pad 164 (in further detail, first wiring bonding pad 1644) and the second bonding pad 166 (in further detail, second wiring bonding pad 1664). The gate contact portion 184 provided in the first pad region PA1 of the bonding memory portion 104 may be insulated from the plurality of gate electrodes 130 included in the second gate stacking structure 124.

The description of the connection or insulation structure of the gate contact portion 184 and the gate electrode 130 in the first pad region PA1 of the base memory portion 102 may be directly applied to the connection or insulation structure of the gate contact portion 184 and the gate electrode 130 in the first or second pad region PA1 and PA2 of the bonding memory portion 104.

In addition, in connection region 14 of bonding memory portion 104, a source contact portion 186 for connecting horizontal conductive layers 112 and 114 and/or the second substrate 110 and circuit region 200, and an input and output connection wiring 199 for connecting the input and output pad 198*a* and the circuit region 200 may be disposed.

In an embodiment, the source contact portion 186 of the bonding memory portion 104 may connect the source contact portion 186 included in the base memory portion 102 to the circuit region 200. For example, the source contact portion 186 of the bonding memory portion 104 may connect the first bonding pad 164 (in further detail, first wiring bonding pad 1644) and the second bonding pad 166 (in further detail, second wiring bonding pad 1664) while penetrating the cell insulation layer 132.

In an embodiment, the input and output connection wiring 188 of the bonding memory portion 104 may connect the input and output connection wiring 188 included in the base memory portion 102 to the circuit region 200. For example, the input and output connection wiring 188 of the bonding memory portion 104 may connect the first bonding pad 164 (in further detail, first wiring bonding pad 1644) and second bonding pad 166 (in further detail, second wiring bonding pad 1664) outside the second gate stacking structure 124 while penetrating the second gate stacking structure 124.

A first surface or one surface 104*a* of the bonding memory portion 104 adjacent to the base memory portion 102 is a bonding surface with the base memory portion 102, and is formed of the first bonding pad 164 and the first insulation layer 132*b* disposed at a periphery of the first bonding pad 164. The first bonding pad 164 may include a first channel bonding pad 1642 connected to the second channel structure CB in the cell array region 12 and the first wiring bonding pad 1644 connected to wiring in the connection region 14. The first wiring bonding pad 1644 may include a plurality of pads each connected to the gate contact portion 184, the source contact portion 186, and the input and output connection wiring 188.

A second surface or other surface 104*b* of the bonding memory portion 104 adjacent to the circuit region 200 is a bonding surface with the circuit region 200, and is composed of the second bonding pad 166 and the second insulation layer 132*c* positioned at a periphery of the second bonding pad 166. The second bonding pad 166 may include a second channel bonding pad 1662 connected to the second channel structure CB in the cell array region 12 and a second wiring bonding pad 1664 connected to wiring in the connection region 14. The second wiring bonding pad 1664 may include a plurality of pads each connected to the gate contact portion 184, the source contact portion 186, and the input and output connection wiring 188.

In an embodiment, the base memory portion 102 may be formed on the second substrate 110, and the other surface 102*b* of the base memory portion 102 and the first surface (e.g., one surface 104*a*) of the bonding memory portion 104 may be bonded by hybrid bonding. In further detail, the other surface 102*b* of the base memory portion 102 and the first surface of the bonding memory portion 104 may be bonded by hybrid bonding including metal bonding and insulation layer bonding. That is, the base memory portion 102 and the bonding memory portion 104 may be bonded (e.g., directly bonded) by metal bonding and insulation layer bonding without a separate semiconductor substrate, interposer substrate, wiring substrate, or the like between the base memory portion 102 and the bonding memory portion 104.

In further detail, the metal bonding may be formed in a state in which the base bonding pad 162 disposed on the other surface 102*b* of the base memory portion 102 and the first bonding pad 164 disposed on the first surface of the bonding memory portion 104 are in direct contact. In this case, the channel bonding pad 1622 and the first channel bonding pad 1642 may be bonded in a state of direct contact, and the wiring bonding pad 1624 and the first wiring bonding pad 1644 may be bonded in a state of direct contact.

For example, the base bonding pad 162 and/or first bonding pad 164 may be made of copper, aluminum, tungsten, nickel, gold, tin, manganese, cobalt, titanium, tantalum, ruthenium, or an alloy including the same. Further, a diffusion barrier layer formed of a metal nitride may be further provided on a bottom surface and/or a side surface of the base bonding pad 162 and/or first bonding pad 164. As described, the base bonding pad 162 and the first bonding pad 164 may have excellent bonding strength due to mutual diffusion (e.g., metal bonding) of the metal (e.g., copper) constituting them in an annealing process for the hybrid bonding.

For example, the base bonding pad 162 and/or first bonding pad 164 includes copper, and the metal bonding of the base memory portion 102 and the bonding memory portion 104 may be formed of copper-to-copper bonding. In this case, the base bonding pad 162 and/or first bonding pad 164 may be made of copper, or may include a layer containing copper at the bonding surface.

In addition, in a periphery of the base bonding pad 162 and the first bonding pad 164, the base insulation layer 132*a* disposed on the other surface 102*b* of the base memory portion 102 and the first insulation layer 132*b* disposed on the first surface of the bonding memory portion 104 may form insulation layer bonding by being bonded in a direct contact state. In an embodiment, the base insulation layer 132*a* and the first insulation layer 132*b* may include the same insulating material on the bonded side. For example, the base insulation layer 132*a* and/or the first insulation layer 132*b* may have a layer including silicon carbonitride (SiCN) on at least the bonded surface of the insulation layer 132. In an annealing process for hybrid bonding, excellent bonding strength may be obtained by bonding (e.g., covalent bonding) of materials or elements included in the base insulation layer 132*a* and the first insulation layer 132*b*.

In the embodiment, one surface of the circuit region 200 and the second surface (e.g., the other surface 104*b*) of the bonding memory portion 104 may be bonded by hybrid bonding. In further detail, the one surface of the circuit region 200 and the second surface of the bonding memory portion 104 may be bonded by hybrid bonding including metal bonding and insulation layer bonding. That is, the circuit region 200 and the bonding memory portion 104 may be bonded by metal bonding and insulation layer bonding without a separate semiconductor substrate, interposer substrate, or wiring substrate between the circuit region 200 and the bonding memory portion 104.

In further detail, the first bonding structure 240 disposed at one side of the circuit region 200 and the second bonding structure (i.e., second bonding pad 164) disposed at the second side of the bonding memory portion 104 are in direct contact to form metal bonding. In this case, the first bonding structure 240 and the second channel bonding pad 1662 may be bonded in a state of direct contact, and the first bonding structure 240 and the first wiring bonding pad 1644 may be bonded in a state of direct contact.

For example, the first bonding structure 240 and/or the second bonding pad 166 may be made of copper, aluminum, tungsten, nickel, gold, tin, manganese, cobalt, titanium, tantalum, ruthenium, or an alloy including the same. Further, a diffusion barrier layer formed of a metal nitride may be further provided on a bottom surface and/or a side surface of the first bonding structure 240 and/or the second bonding pad 166. As described, the first bonding structure 240 and the second bonding pad 166 may have excellent bonding strength due to mutual diffusion (e.g., metal bonding) of the metal (e.g., copper) constituting them in an annealing process for the hybrid bonding.

For example, the first bonding structure 240 and/or the second bonding pad 166 includes copper, and the metal bonding of the circuit region 200 and the bonding memory portion 104 may be formed of copper-to-copper bonding. In this case, the first bonding structure 240 and/or the second bonding pad 166 may be made of copper, or include a layer containing copper on the bonding surface.

In addition, in a periphery of first bonding structure 240 and/or the second bonding pad 166, the insulation layer 250 disposed on one surface of the circuit region 200 and the second insulation layer 132*c* disposed on the second surface of the bonding memory portion 104 may form insulation layer bonding by being bonded in a direct contact state. In an embodiment, the insulation layer 250 and the second insulation layer 132*c* may include the same insulating material on the bonding surface. For example, the insulation layer 250 and the second insulation layer 132*c* may have a layer including a silicon carbonitride (SiCN) on at least a bonding surface. In an annealing process for hybrid bonding, excellent bonding strength may be obtained by bonding (e.g., covalent bonding) of materials or elements included in the insulation layer 250 and the second insulation layer 132*c*.

In the base memory portion 102, the first channel structure CA may be extended and connected from the second substrate 110 and/or horizontal conductive layers 112 and 114 to the channel bonding pad 1622. In the bonding memory portion 104, the second channel structure CB may be extended and connected to the first channel bonding pad 1642 bonded to the channel bonding pad 1622 and the second channel bonding pad 1662 bonded to the first bonding structure 240. As described, the first channel structure CA and the second channel structure CB connected through the channel bonding pad 1622, the first channel bonding pad 1642, and the second channel bonding pad 1662 may form the channel structure CH.

The channel structure CH each form one memory cell string, and a plurality of channel structures CH form rows and columns on a plane and can be spaced apart from each other. For example, a plurality of channel structures CH may be disposed in any of various forms, e.g., a lattice form and a zigzag form (as viewed in a plane view).

In the embodiment, the channel bonding pad 1622, the first channel bonding pad 1642, and/or the second channel bonding pad 1662 may extend in in the second direction (X-axis direction of drawing) crossing the first direction (Y-axis direction of drawing) in which gate electrode 130 extends. That is, the channel bonding pad 1622, the first channel bonding pad 1642, and/or the second channel bonding pad 1662 connected to the first channel structure CA and/or the second channel structure CB may be formed of bit lines. Accordingly, the wiring structure can be simplified by using the bit line as a bonding pad without a separate structure.

For example, the bit line, the channel bonding pad 1622, the first channel bonding pad 1642, and/or the second channel bonding pad 1662 may directly connected to the first channel structure CA and/or the second channel structure CB without separate members such as a contact via and a stud (for example, contact connection). Accordingly, the structure can be simplified. However, the embodiment is not limited thereto, and another embodiment will be described in detail later with reference to FIG. 5.

The gate contact portion 184 may connect a connection gate electrode of the plurality of gate electrodes 130 and the circuit region 200. In an embodiment, the gate contact portion 184 has a structure connected to the circuit region 200 through the plurality of gate electrodes 130, and the gate contact portion 184 and the circuit region 200 may be connected with a simple structure in a structure including the base memory portion 102 and the bonding memory portion 104. Accordingly, an additional wiring for connecting the gate contact portion 184 to the circuit region 200 is not included, a degree of freedom in design can be improved. However, a separate wiring connected to the gate contact portion 184 may be provided depending on embodiments.

In the base memory portion 102 of the first pad region PA1, the gate contact portion 184 may connect the connection gate electrode and the wiring bonding pad 1624. In the bonding memory portion 104 of the first pad region PA1, the gate contact portion 184 may be insulated from the plurality of gate electrodes 130, and connect the first wiring bonding pad 1644, which is bonded to a corresponding wiring bonding pad 1624, and the second wiring bonding pad 1664 bonded to the first bonding structure 240. Accordingly, the gate contact portion 184 connected to the connection gate electrode included in the base memory portion 102 in the first pad region PA1 can be connected to the circuit region 200.

In the bonding memory portion 104 of the second pad region PA2, a gate contact portion 184 may connect the connection gate electrode and the second wiring bonding pad 1664. Accordingly, in the second pad region PA2, the gate contact portion 184 connected to the connection gate electrode included in the bonding memory portion 104 may be connected to the circuit region 200.

In the drawing and the above description, an example that one first pad region PA1 and one second pad region PA2 are sequentially positioned in a direction oriented from the cell array region 12 toward the connection region 14 (e.g., in the Y-axis) are described. However, the first pad region PA1 and the second pad region PA2 may be provided in plurality, or an arrangement of the first pad region PA1 and the second pad region PA2 may be variously modified. In this case, the gate contact portion 184 may still have a structure, an arrangement, or the like that connects the connection gate electrode and the circuit region 200.

The source contact portion 186 may connect the second substrate 110 and/or horizontal conductive layers 112 and 114 and the circuit region 200. For example, in the base memory portion 102, the source contact portion 186 may connect the second substrate 110 and/or horizontal conductive layers 112 and 114 and the wiring bonding pad 1624. In the bonding memory portion 104, the source contact portion 186 may connect the first wiring bonding pad 1644 bonded to the above-described wiring bonding pad 1624 and the second wiring bonding pad 1664 bonded to the first bonding structure 240.

The input and output connection wiring 188 may connect the input and output pad 198*a* and the circuit region 200. For example, in the second substrate 110 and the base memory portion 102, the input and output connection wiring 188 may connect the input and output pad 198*a* and wiring bonding pad 1624. In the bonding memory portion 104, the input and output connection wiring 188 may connect the first wiring bonding pad 1644 bonded to the above-described wiring bonding pad 1624 and the second wiring bonding pad 1664 bonded to the first bonding structure 240.

In an embodiment, the bonding memory portion 104 may have a normal structure (e.g., a structure having gate electrodes with decreased lengths as a vertical distance from the circuit region 200 increases), and the base memory portion 102 may have a reverse structure (e.g., an inverted structure with respect to the bonding memory portion 104 to have gate electrodes with increased lengths as a vertical distance from the circuit region 200 increases). For example, the normal structure refers to a structure in which a portion disposed at an upper portion in a manufacturing process or a portion disposed far from a substrate (e.g., a carrier substrate 110*a*) is disposed at an upper portion in a final structure. In addition, the reverse structure refers to a structure in which a portion disposed at an upper portion in a manufacturing process or a portion disposed far from a substrate (e.g., the second substrate 110) is disposed at a lower portion in a final structure. In the descriptions related to FIG. 1 to FIG. 3, and FIG. 5 to FIG. 7, the upper portion in the final structure refers to a portion disposed far from the circuit region 200, and the lower portion in the final structure refers to a portion disposed close to the circuit region 200.

In a manufacturing process, when the base memory portion 102 is bonded to the bonding memory portion 104, the base memory portion 102 may be reversed in a vertical direction or be in a reverse or upside-down state where an upper portion and a lower portion are reversed. Thus, the bonding memory portion 104 has a normal structure and the base memory portion 102 has a reversed structure. Then, when the cell region 100 is bonded to the circuit region 200, the cell region 100 may be reversed in a vertical direction or be in a reverse or upside-down state where an upper portion and a lower portion are reversed. Accordingly, the bonding memory portion 104 has a normal structure in a final structure, and the base memory portion 102 has a reverse structure in a final structure. This will be described in more detail in the manufacturing method of semiconductor device 10 later.

The normal structure and the reverse structure may be distinguished by a shape of the first channel structure CA or the second channel structure CB, the separation structure 146, and a shape of the plurality of gate electrodes 130 in the connection region 14.

For example, in the bonding memory portion 104 having a normal structure, when the second channel structure CB or the separation structure 146 has a sloped or inclined side surface, the sloped or inclined side surface may be disposed to narrow a width as it goes from an upper portion to a lower portion (i.e., toward the circuit region 200). On the other hand, in the base memory portion 102 having a reverse structure, when the first channel structure CA or the separation structure 146 has a sloped or inclined side surface, the sloped or inclined side surface may be disposed to widen a width as it goes from an upper portion to a lower portion (i.e., toward the circuit region 200). In cases where the gate contact portion 184 and the source contact portion 186 have sloped or inclined side surfaces, they may have the same aspect.

As another example, in the bonding memory portion 104 having a normal structure, at a portion where the plurality of gate contact portions 184 are connected to the plurality of gate electrodes 130 disposed in the connection region 14, lengths of the gate electrode 130 may be sequentially increased from an upper portion to a lower portion (i.e., toward the circuit region 200) to form a stair shape in a regular direction. On the other hand, in the base memory portion 102 having a reverse structure, at a portion where the plurality of gate contact portions 184 are connected to the plurality of gate electrodes 130 disposed in the connection region 14, length of the gate electrode 130 may be sequentially shortened from an upper portion to a lower portion (i.e., toward the circuit region 200) to form a stair shape in a reverse direction.

In an embodiment, one base memory portion 102 formed on the second substrate 110 may be provided, and one or a plurality of bonding memory portions 104 may be provided. Considering a limit of a number of memory cells in one memory portion, one base memory portion 102 may be formed on the second substrate 110, and a bonding memory portion 104 may be separately manufactured and bonded to the base memory portion 102. In further detail, after forming the bonding memory substrate where the bonding memory portion 104 is formed on a carrier substrate (refer to 110*a* in FIG. 4B, hereinafter the same), the bonding memory substrate is bonded to the base memory portion 102 and then the carrier substrate 110*a* is removed, thereby forming the bonding memory portion 104. This will be described in more detail in a manufacturing method of the semiconductor device 10 later. As described, since the bonding memory portion 104 is formed separately and bonded, the bonding memory portion 104 may include one bonding memory portion or a plurality of bonding memory portion.

According to an embodiment, in the semiconductor device 10 (e.g., a bonding memory device) to which the cell region 100 and the circuit region 200 are bonded, the cell region 100 includes the base memory portion 102 formed on the second substrate 110 and the bonding memory portion 104 bonded to the base memory portion 102. In this case, the cell region 100 may be formed by forming the base memory portion 102 and the bonding memory portion 104 separately considering a limit of a number of memory cells in the manufacturing process, and then, the base memory portion 102 and the bonding memory portion 104 may be bonded to each other. Accordingly, a number of memory cells included in the cell region 100 can be effectively increased regardless of a limit of a number of memory cells in a manufacturing process. For example, in a process of forming a plurality of sacrificial layers and then forming a plurality of gate electrodes 130 by replacing the plurality of sacrificial layers with a conductive material, there is a certain limit to a number of gate electrodes 130 that can be replaced with a conductive material, and in an embodiment, a number of memory cells can be effectively increased regardless of such a limit. Accordingly, performance and efficiency of the semiconductor device 10 can be improved.

Here, the base memory portion 102 and the bonding memory portion 104 may be bonded to each other by hybrid bonding including metal bonding and insulation layer bonding, and each may be provided with a GIDL transistor. Since the base memory portion 102 and the bonding memory portion 104 each includes a GIDL transistor, an individual erase operation is possible even when the bonding memory portion 104 is bonded to the base memory portion 102 and the circuit region 200 without using a separate semiconductor substrate, interposer substrate, or wiring substrate.

In addition, a plurality of memory portions (i.e., the base memory portion 102 and the bonding memory portion 104) included in the cell region 100 may share one circuit region 200. Accordingly, a structure of the semiconductor device 10 can be simplified. In addition, since the circuit region 200 and the plurality of memory portions are individually formed, a structure and a process suitable for the circuit region 200 and the plurality of memory portions may be applied, thereby improving performance of the semiconductor device 10.

An example of a manufacturing method of the semiconductor device 10 will be described in detail with reference to FIG. 4A to FIG. 4G. FIG. 4A to FIG. 4G are schematic cross-sectional views of an example of a manufacturing method of the semiconductor device 10 shown in FIG. 1.

Referring to FIG. 4A to FIG. 4G, a manufacturing method of a semiconductor device 10 according to an embodiment includes forming of a memory substrate that includes a base memory substrate and a bonding memory substrate, forming of a cell region 100 by including bonding the bonding memory substrate to the base memory substrate and removing the carrier substrate 110*a*, and bonding of the cell region 100 to the circuit region 200. This will be described in detail with reference to FIG. 4A to FIG. 4G.

Figure 4A:
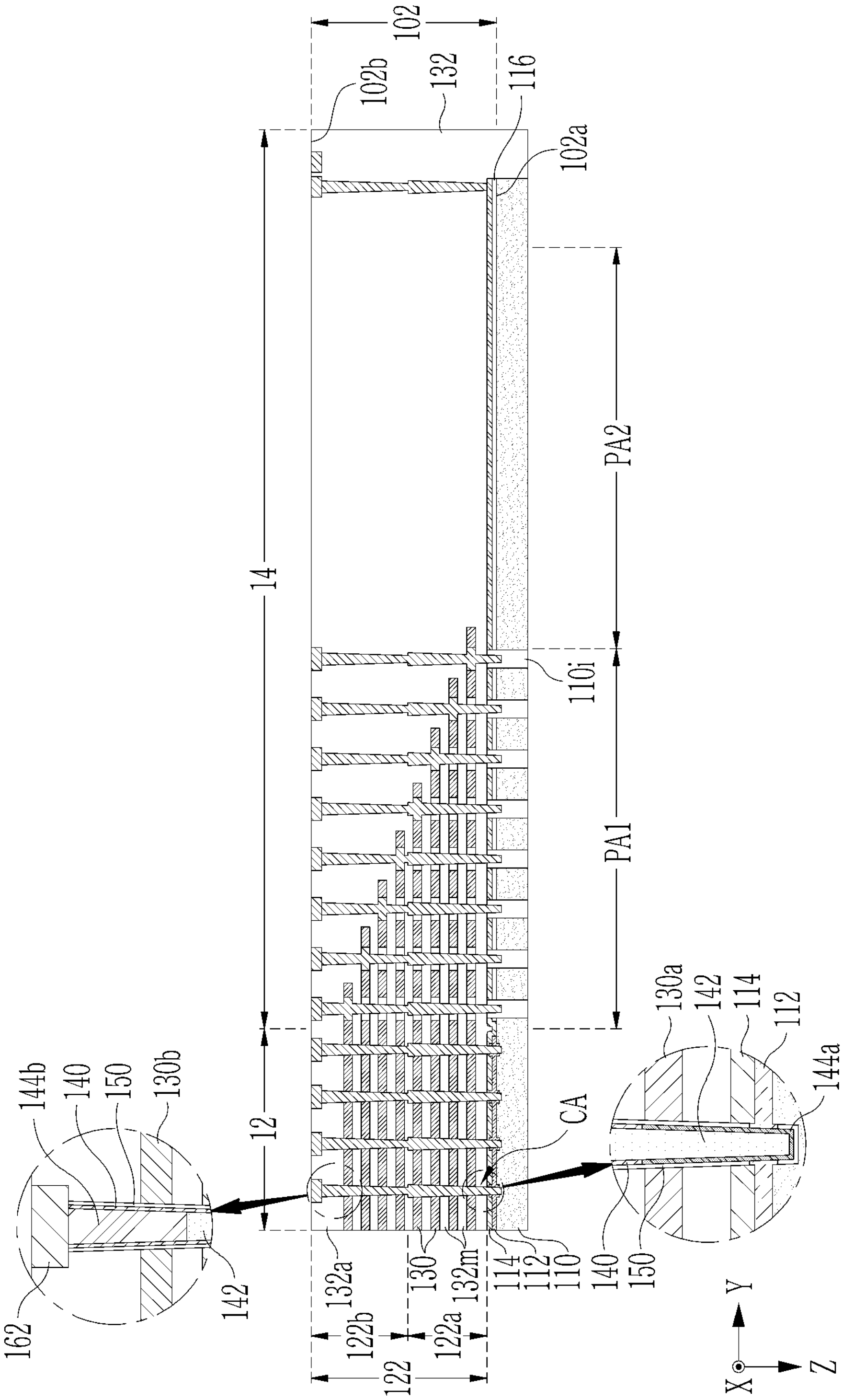
FIG. 4A to FIG. 4G are schematic cross-sectional views of stages in a manufacturing method of the semiconductor device shown in FIG. 1.
Figure 4B:
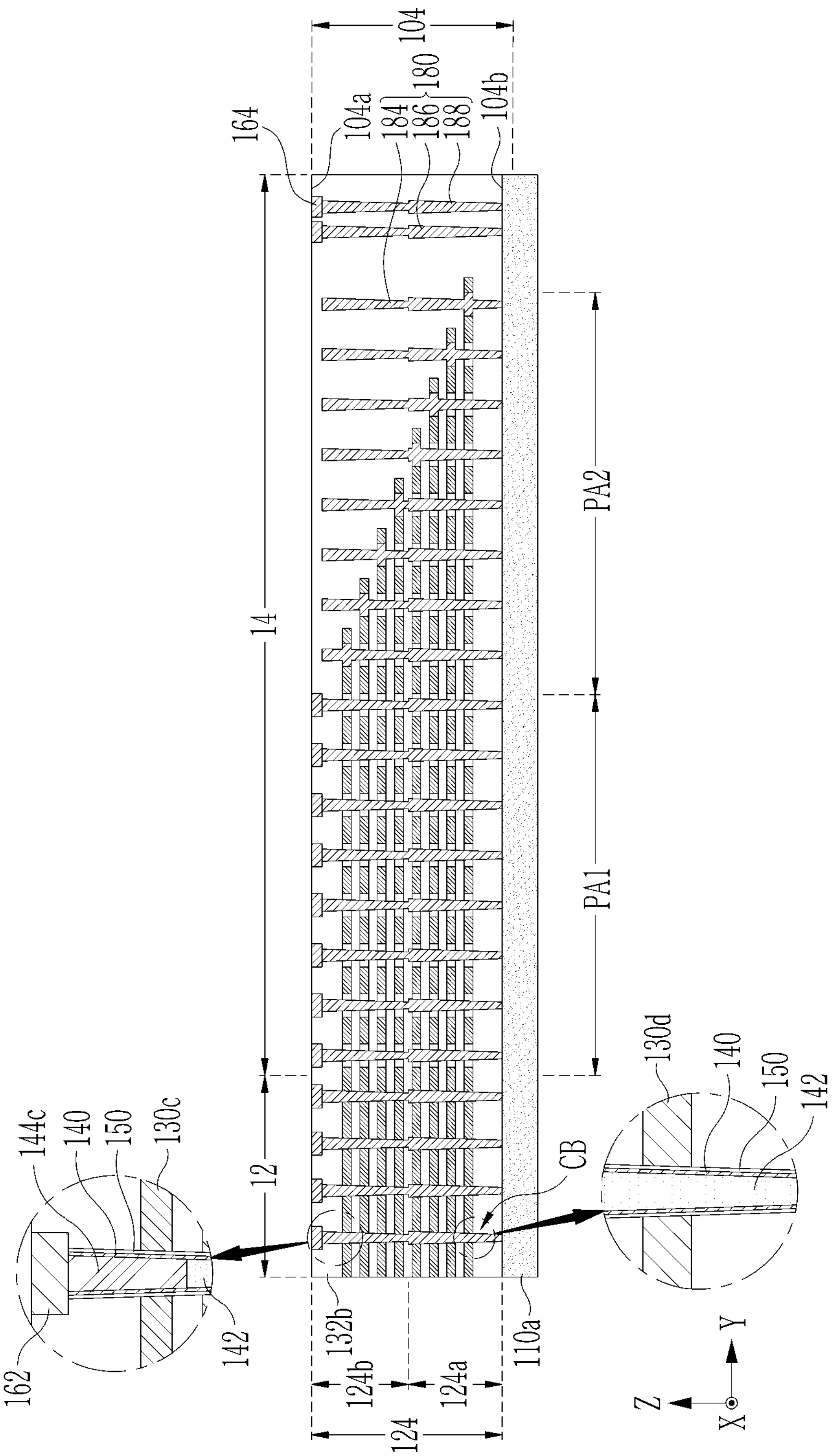

First, as shown in FIG. 4A, a base memory substrate may be formed, and as shown in FIG. 4B, a bonding memory substrate may be formed. A process of forming the base memory substrate and a process of forming the bonding memory substrate are separate processes, and the embodiment is not limited to an order of these processes.

Here, the base memory substrate may include the second substrate 110, and the base memory portion 102 formed on one surface of the second substrate 110. The base memory portion 102 may include the first gate stacking structure 122 formed in the cell array region 12 and a pad region (e.g., the first pad region PA1), the first channel structure CA penetrating the first gate stacking structure 122, and the gate contact portion 184 connected to the gate electrodes 130 in the first pad region PA1. In addition, the source contact portion 186 may be further provided in the connection region 14. In addition, the base bonding pad 162 may be provided on the other surface 102*b* of the base memory portion 102.

The base memory substrate may be formed by forming a plurality of layers, a channel structure, a contact portion, and the like constituting the base memory portion 102 on the second substrate 110 as described above. A process of forming the base memory portion 102 on the second substrate 110 may use any or various methods, e.g., a deposition process and an etching process.

For example, formation of the first gate stacking structure 122 in the base memory substrate is as follows. A preliminary stacking structure including a plurality of insulation layers 132 and a plurality of sacrificial layer that are alternately stacked on the substrate 110 are formed, and then, a plurality of gate electrodes 130 may be formed by replacing the plurality of sacrificial layers with a conductive material. Then, the first gate stacking structure 122 including the plurality of insulation layers 132 and the plurality of gate electrodes 130 that are alternately stacked may be included. For example, a base insulation layer 132*a* may be provided at a periphery of the base bonding pad 162 on the other surface 102*b* of the base memory portion 102 or the first gate stacking structure 122.

In an embodiment, the first channel structure CA of the base memory substrate may have a doping region 144*a* and a channel pad 144*b*. For example, formation of the first channel structure CA is as follows. A through portion is formed at the preliminary stacking structure for forming the first gate stacking structure 122, and then, at least a portion of the gate dielectric layer 150, the channel layer 140, and the core insulation layer 142 may be formed. In addition, in a process of forming the first horizontal conductive layer 112 or before or after the process of forming the first horizontal conductive layer 112, impurity or dopant may be diffused to a portion of the channel layer 140 adjacent to the second substrate 110 to form the doping region 144*a*. The channel pad 144*b* electrically connected to the channel layer 140 may be formed at an upper portion of the core insulation layer 142 adjacent to the other surface 102*b* of the base memory portion 102.

For example, formation of the base bonding pad 162 on the base memory substrate is as follows. A base insulation layer 132*a* may be formed on the other surface 102*b* of the base memory portion 102, and a portion of the base insulation layer 132*a* where the base bonding pad 162 is to be positioned may be etched to form the base bonding pad 162 on the corresponding portion. The base bonding pad 162 may be connected to the first channel structure CA, the gate contact portion 184, the source contact portion 186, and the like, and may be formed in a portion where an input and output connection wiring (reference numeral 188 in FIG. 4G, hereinafter the same) to be positioned. However, the embodiment is not limited thereto, and the base bonding pad 162 and the base insulation layer 132*a* positioned at a periphery of the base bonding pad 162 may be formed by any of various other methods.

In FIG. 4A, an input and output pad (refer to reference numeral 198*a* in FIG. 4G, hereinafter the same), an insulation layer (refer to reference numeral 198*b* in FIG. 4G, hereinafter the same), and a source connection pattern (refer to reference numeral 198*c* in FIG. 4G, hereinafter the same) are not disposed at a surface of the second substrate 110 opposite to the base memory portion 102, and the base memory portion 102 does not include an input and output connection wiring 188. In this case, the input and output pad 198*a*, the insulation layer 198*b*, the source connection pattern 198*c*, and the input and output connection wiring 188 may be formed later in a state that the cell region 100 is bonded to the circuit region 200. Accordingly, it may be possible to simplify and stabilize a manufacturing process, which will be described in detail with reference to FIG. 8G, later. However, the embodiment is not limited thereto, and the input and output pad 198*a*, the insulation layer 198*b*, the source connection pattern 198*c*, or the input and output connection wiring 188 may be formed before a process of bonding the cell region 100 to the circuit region 200. Meanwhile, a bonding memory substrate may include the carrier substrate 110*a* and the bonding memory portion 104 formed on one surface of the carrier substrate 110*a*.

The carrier substrate 110*a* may be the same substrate as the second substrate 110 except that it is removed after bonding of the bonding memory substrate to the base memory substrate. For example, the carrier substrate 110*a* may be a semiconductor substrate including a semiconductor material. For example, the carrier substrate 110*a* may be a semiconductor substrate formed of a semiconductor material, or may be a semiconductor substrate in which a semiconductor layer is formed on a base substrate. For example, the carrier substrate 110*a* may be formed of single crystal, polysilicon, epitaxial silicon, germanium, silicon-germanium, silicon-on-insulator, or germanium-on-insulator. However, the embodiment is not limited thereto, and the carrier substrate 110*a* may be formed of a substrate (e.g., an insulating substrate) not including a semiconductor material.

The bonding memory portion 104 may include the second gate stacking structure 124 formed in the cell array region 12 and the pad region PA, the second channel structure CB penetrating the gate stacking structure 124 in the cell array region 12, and the gate contact portion 184 connected to the gate electrode 130 in a pad region (e.g., the second pad region PA2). In addition, the gate contact portion 184, the source contact portion 186, and the input and output connection wiring 188 that are not connected to the gate electrode 130 and are connected to the gate contact portion 184, the source contact portion 186, and the input and output connection wiring 188 included the base memory portion 102 may be further provided in the connection region 14. In addition, the first bonding pad 164 may be provided on one surface 104*a* of the bonding memory portion 104.

A bonding memory substrate may be formed by forming a plurality of layers, a channel structure, a contact portion, and the like constituting the bonding memory portion 104 on the carrier substrate 110*a* as described above. For a process of forming the bonding memory portion 104 on the carrier substrate 110*a*, any of various methods, e.g., a deposition process and an etching process, may be used.

For example, formation of the second gate stacking structure 124 in the bonding memory substrate is as follows. A preliminary stacking structure including a plurality of inter-layer insulation layers 132*m* and a plurality of sacrificial layers that are alternately stacked may be formed on the carrier substrate 110*a*, and then, a plurality of gate electrodes 130 may be formed by replacing the plurality of sacrificial layers with a conductive material. Then, the second gate stacking structure 124 including a plurality of insulation layer 132 and a plurality of gate electrodes 130 that are alternately stacked may be included. For example, a first insulation layer 132*b* may be provided at a periphery of the first bonding pad 164 at one surface 104*a* of the second gate stacking structure 124.

In an embodiment, in the bonding memory substrate, the second channel structure CB includes the first channel pad 144*c* disposed in a portion adjacent to the one surface 104*a* of the bonding memory portion 104, but may not include a second channel pad (reference numeral 144*d* of FIG. 4E) disposed at a portion adjacent to the other surface 104*b*. For example, formation of the second channel structure CB in the bonding memory substrate is as follows. A through portion may be formed at the preliminary stacking structure for forming the second gate stacking structure 124, and then, at least a portion of a gate dielectric layer 150, the channel layer 140, and the core insulation layer 142 may be formed. The first channel pad 144*c* electrically connected to the channel layer 140 may be formed on an upper portion of the core insulation layer 142 adjacent to one surface 104*a* of the bonding memory portion 104.

For example, formation of the first bonding pad 164 is as follows. The first insulation layer 132*b* may be formed on one surface 104*a* of the bonding memory portion 104, and a portion of the first insulation layer 132*b* where the first bonding pad 164 is to be positioned may be etched to form the first bonding pad 164 in the corresponding portion. The first bonding pad 164 may be connected to the second channel structure CB, the gate contact portion 184, the source contact portion 186, and the like, and may be formed in a portion where the input and output connection wiring 188 is disposed. However, the embodiment is not limited thereto, and the first bonding pad 164 and the first insulation layer 132*b* positioned at a periphery of the first bonding pad 164 may be formed by various other methods.

Figure 4C:
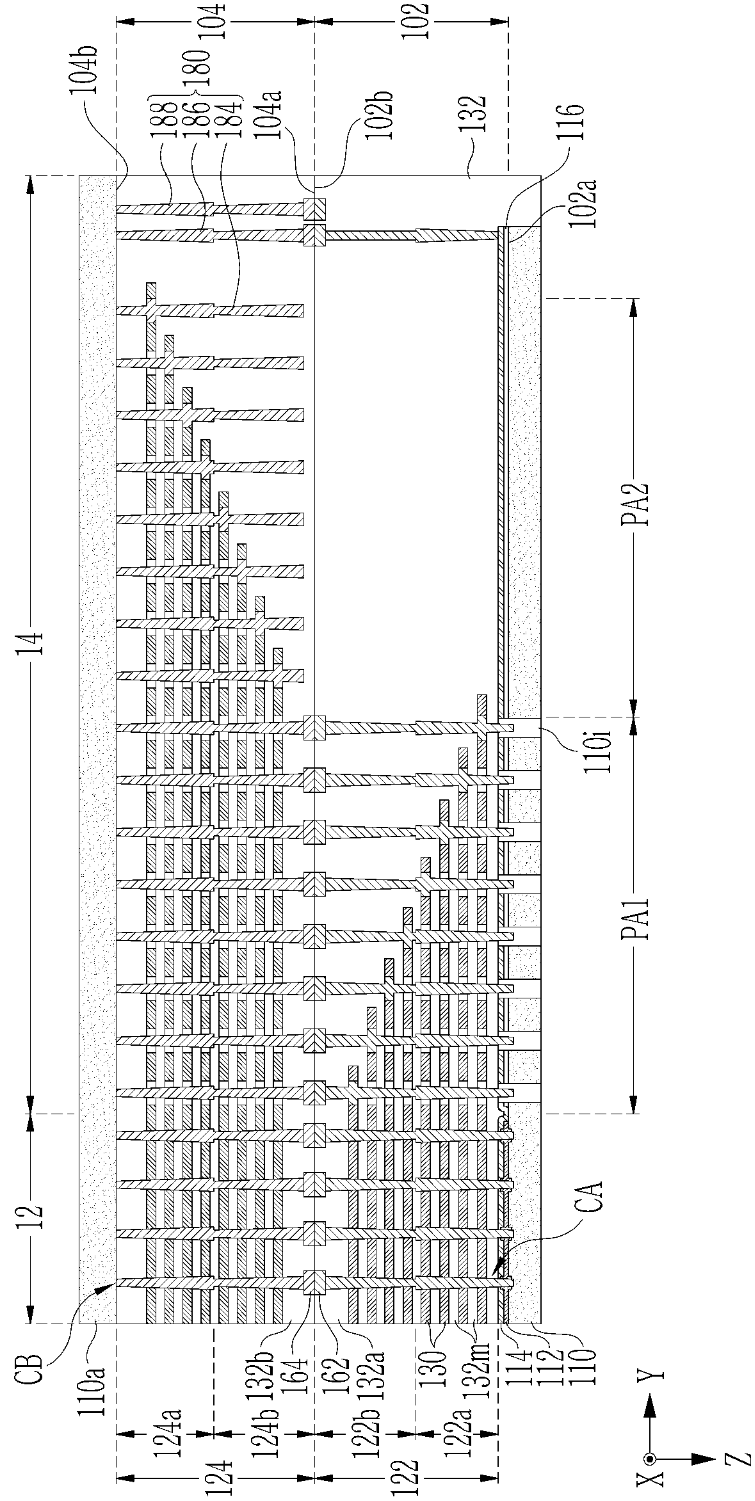
Figure 4D:
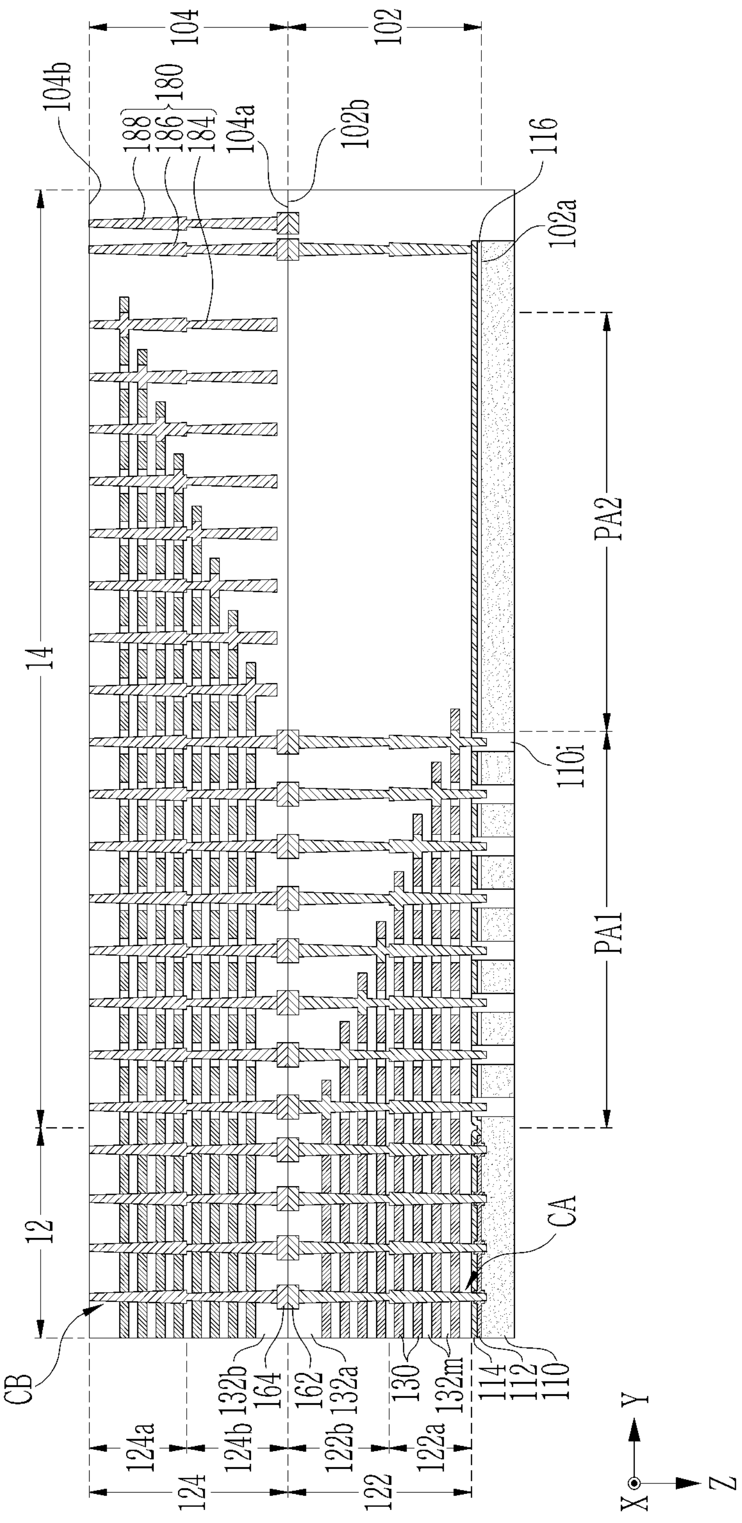
Figure 4E:
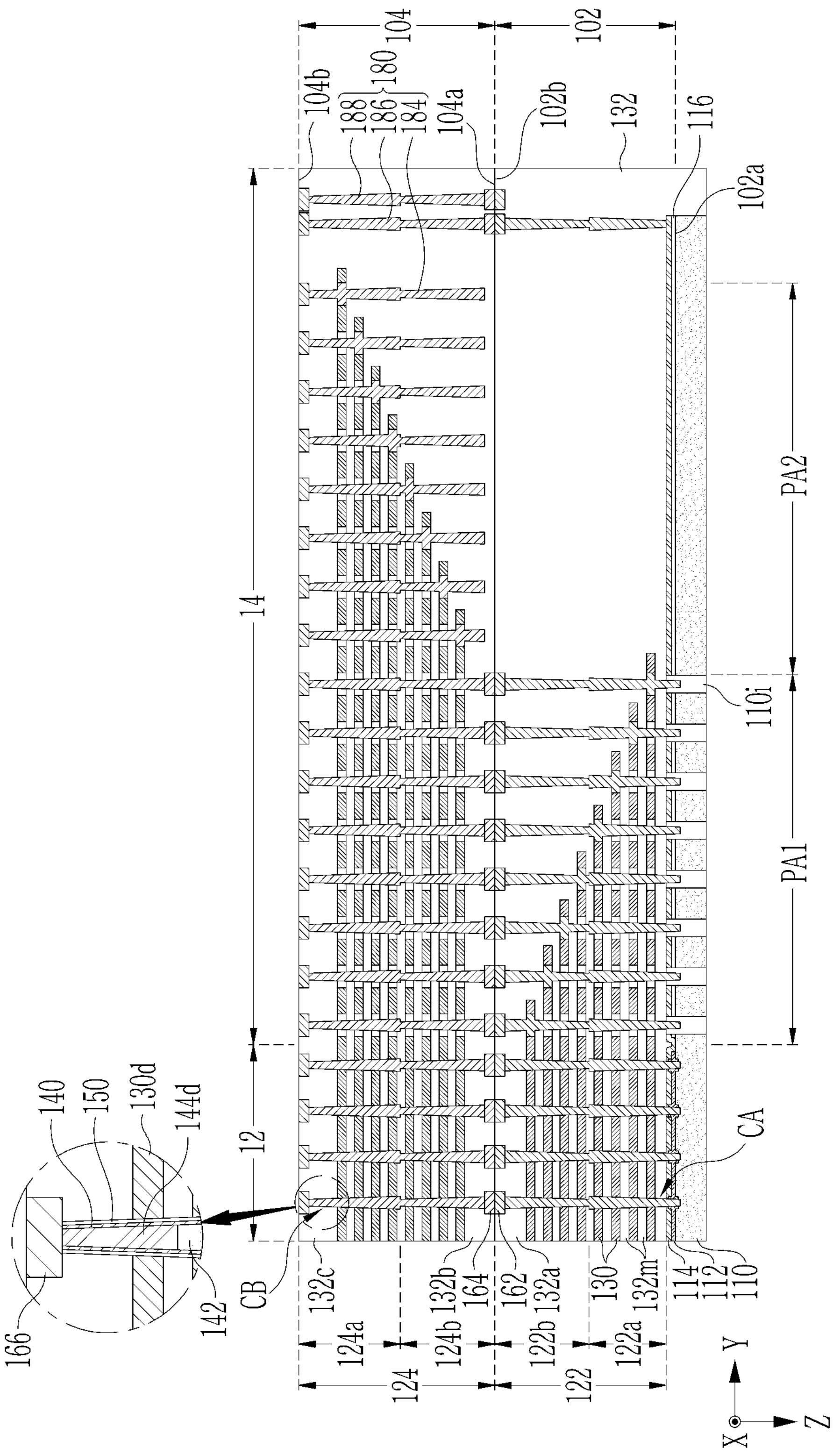

Subsequently, as shown in FIG. 4C to FIG. 4E, the base memory substrate and the bonding memory substrate are bonded and then the carrier substrate 110*a* is removed, thereby bonding a bonding memory portion to a base memory portion. In this way, the cell region 100 can be formed.

In further detail, as shown in FIG. 4C, a first surface (e.g., one surface 104*a*) of the bonding memory portion 104 of the bonding memory substrate shown in FIG. 4B may be bonded onto the base memory portion 102 of the base memory substrate shown in FIG. 4A.

In the bonding process of the base memory substrate and the bonding memory substrate, the bonding memory portion 104 may be bonded in a reverse or upside-down state where an upper portion and a lower portion are reversed to have a reverse structure to the base memory substrate disposed in a normal structure. According to this, the carrier substrate 110*a* included in the bonding memory substrate is disposed at an upper side such that a removal process of the carrier substrate 110*a* to be performed later may be easily performed.

The base memory substrate and the bonding memory substrate may be bonded by hybrid bonding including metal bonding of the base bonding pad 162 and the first bonding pad 164, and insulation layer bonding of the base insulation layer 132*a* and the first insulation layer 132*b*. For example, hybrid bonding may be performed by performing an annealing process while the base memory substrate and the bonding memory substrate are in contact with each other.

Subsequently, as shown in FIG. 4D, the carrier substrate 110*a* may be removed. As a process of removing the carrier substrate 110*a*, any of various processes, e.g., an etching process, a chemical mechanical polishing process, and a peeling process, may be applied.

Subsequently, as shown in FIG. 4E, after the carrier substrate 110*a* is removed, a second channel pad 144*d* and a second bonding pad 166 may be formed. In this case, a second insulation layer 132*c* disposed at a periphery of the second bonding pad 166 may be provided. Accordingly, the bonding memory portion 104 may be formed and the cell region 100 may be formed.

In further detail, a second channel pad 144*d* electrically connected to the channel layer 140 may be formed on the core insulation layer 142 at a portion adjacent to the other surface 104*b* of the bonding memory portion 104.

For example, a process of forming the second bonding pad 166 is as follows. At the second insulation layer 132*c* disposed on the other surface 104*b* of the bonding memory portion 104, a portion where the second bonding pad 166 will be formed may be etched. Then, the second bonding pad 166 may be formed at the corresponding portion. The second bonding pad 166 may be connected to the second channel structure CB, the gate contact portion 184, the source contact portion 186, the input and output connection wiring 188, and the like. However, the embodiment is not limited thereto, and the second bonding pad 166 and the second insulation layer 132*c* disposed on the same layer may be formed by any of various other methods.

Figure 4F:
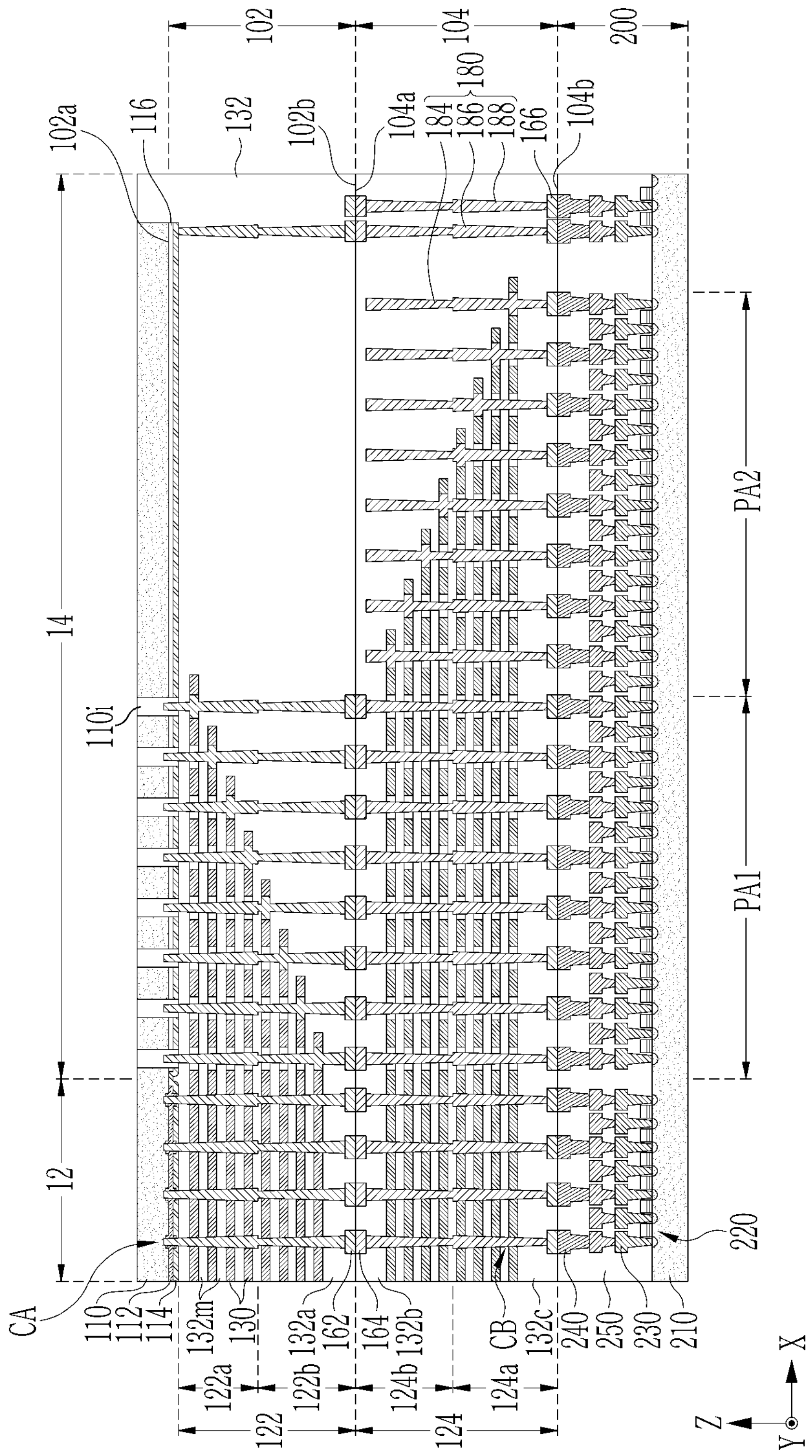

Subsequently, as shown in FIG. 4F, the cell region 100 may be bonded to the circuit region 200. For example, the second surface (e.g., the other surface 104*b*) of the bonding memory portion 104 may be bonded on the circuit region 200.

In a process of bonding the cell region 100 to the circuit region 200, the cell region 100 shown in FIG. 4E may be bonded in a reverse or upside-down state where an upper portion and a lower portion are reversed to the circuit region 200. As a result, the base memory portion 102, which had a normal structure in the forming process of the cell region 100, may have a reverse structure where an upper portion and a lower portion are reversed in a final structure, and the bonding memory portion 104, which was bonded in a reverse structure where an upper portion and a lower portion are reversed in the forming process of cell region 100, may have a normal structure in a final structure.

The circuit region 200 and the cell region 100 may be bonded by hybrid bonding including metal bonding of the first bonding structure 240 and the second bonding pad 166, which is the second bonding structure, and insulation layer bonding of the insulation layer 250 and the second insulation layer 132*c*. For example, hybrid bonding may be performed by performing an annealing process while the circuit region 200 and the cell region 100 are in contact with each other.

Figure 4G:
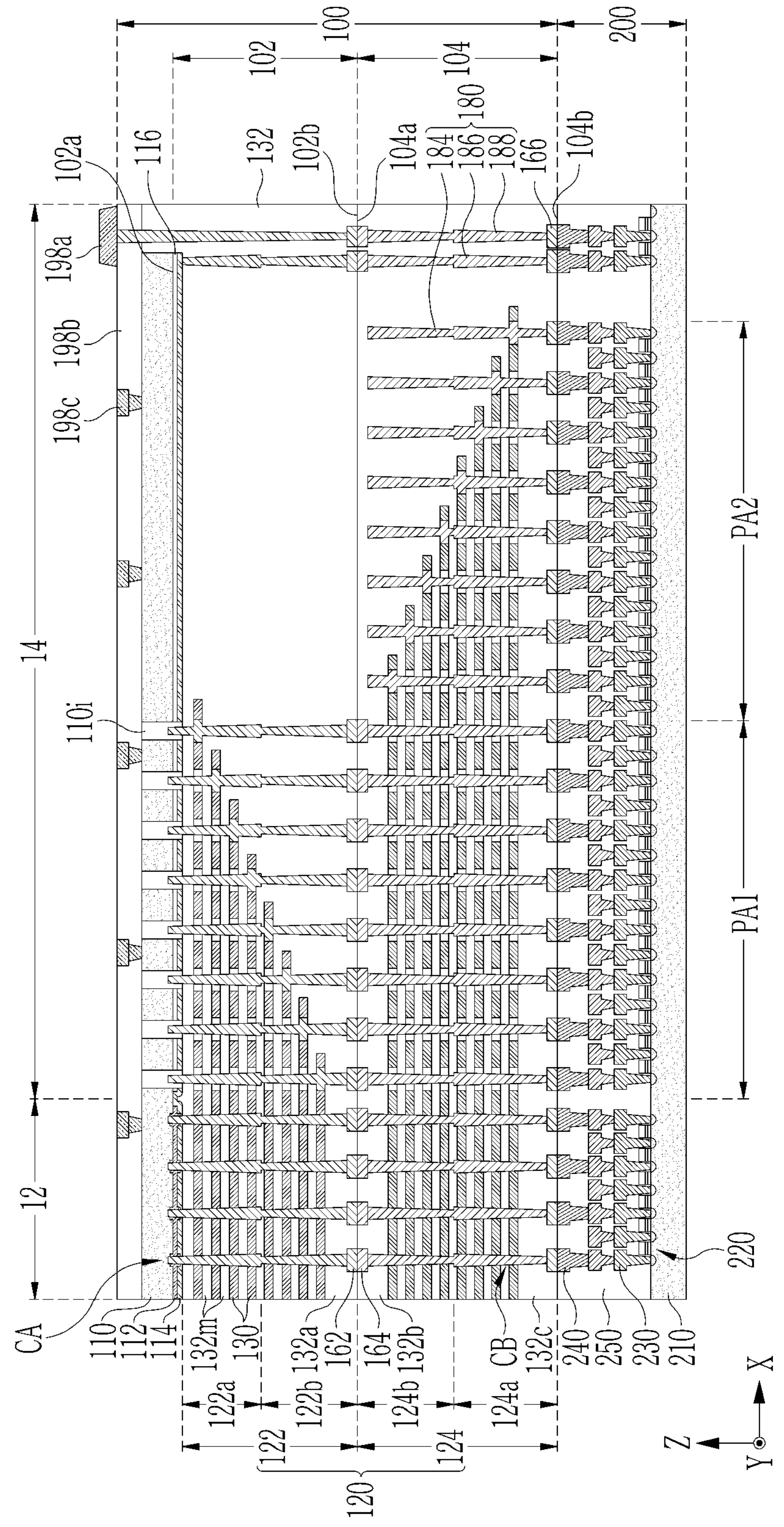

Subsequently, as shown in FIG. 4G, the semiconductor device 10 may be formed by forming the input and output connection wiring 188, the input and output pad 198*a*, the insulation layer 198*b*, and the source connection pattern 198*c*.

For example, the insulation layer 198*b* may be formed on the other surface of the second substrate 110 or an external surface of the second substrate 110 opposite to the base memory portion 102, and then, the input and output connection wiring 188 may be formed and the input and output pad 198*a* connected to the input and output connection wiring 188 may be formed. After forming the insulation layer 198*b*, a source connection pattern 198*c* may be formed. The source connection pattern 198*c* may be formed before or after the forming process of the input and output connection wiring 188 and/or the input and output pad 198*a*, and the embodiment is not limited to a forming sequence of the source connection pattern 198*c*, the input and output connection wiring 188, and the input and output pad 198*a*.

In this way, in a state that the other surface or the external surface of the second substrate 110 opposite to the base memory portion 102 is exposed at an upper portion, the input and output pad 198*a*, the insulation layer 198*b*, and the source connection pattern 198*c* are formed at the other surface or the external surface of the base memory portion 102. A forming process of the input and output pad 198*a*, the insulation layer 198*b*, and the source connection pattern 198*c* can be simplified and stabilized.

According to an embodiment, the cell region 100 having excellent performance and efficiency by having a plurality of memory portions can be formed through a simple process using hybrid bonding. In addition, the cell region 100 may be bonded to the circuit region 200 through a simple process using hybrid bonding. Accordingly, the semiconductor device 10 having excellent performance and efficiency can be formed through a simple process.

Hereinafter, referring to FIG. 5, FIG. 6, FIG. 7, and FIG. 8A to FIG. 8E, other embodiments will be described in more detail. Detailed descriptions are omitted for parts identical or extremely similar to those already described, and other parts are described in detail.

Figure 5:
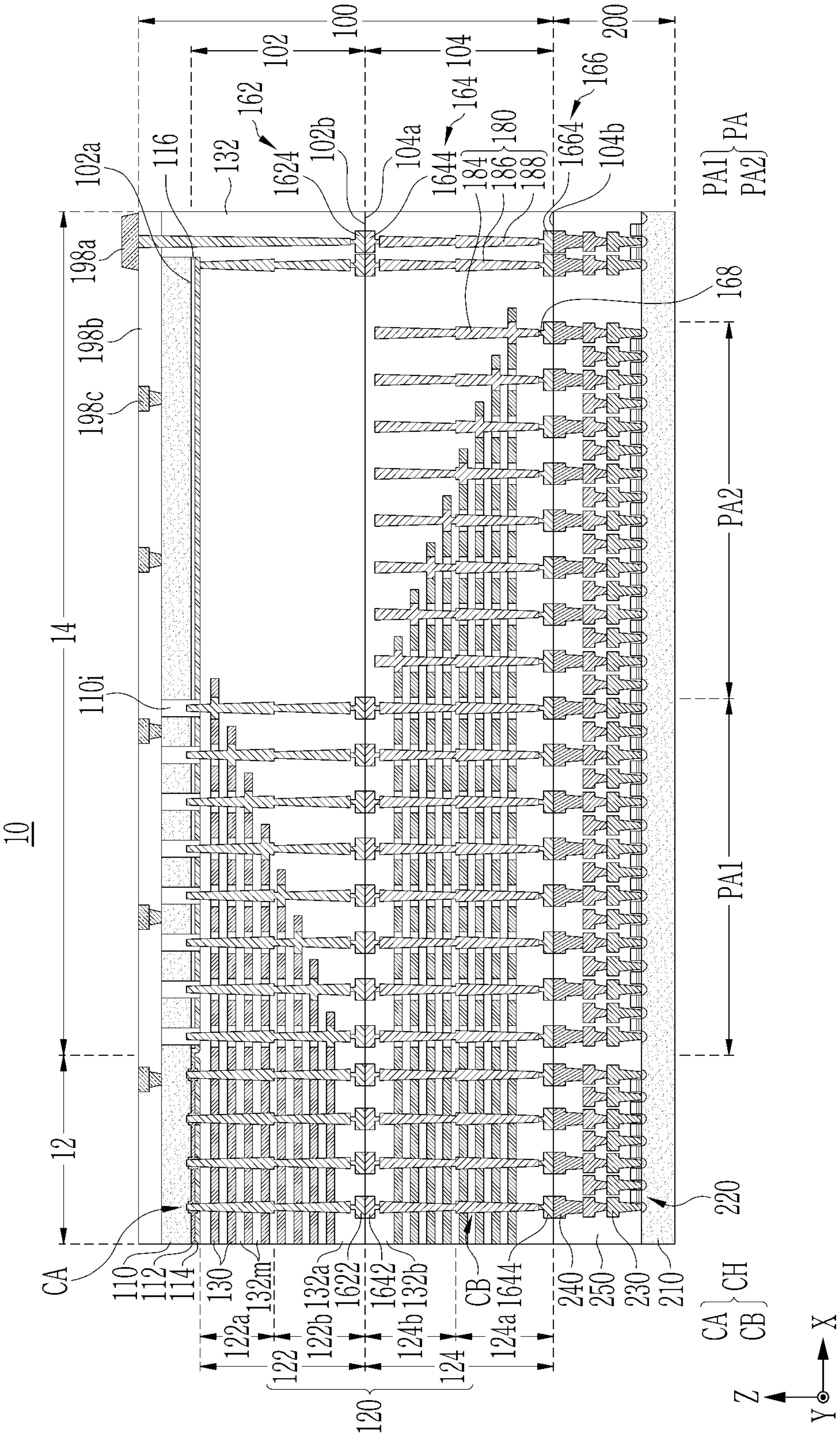
FIG. 5 is a schematic cross-sectional view of a semiconductor device according to another embodiment.

FIG. 5 is a schematic cross-sectional view of a semiconductor device according to another embodiment.

Referring to FIG. 5, in a semiconductor device according to an embodiment, in a base memory portion 102, a contact via 168 may be disposed between a first channel structure CA and a base bonding pad 162, between a gate contact portion 184 and the base bonding pad 162, between a source contact portion 186 and the base bonding pad 162, between an input and output connection wiring 188 and the base bonding pad 162, or the like. That is, the first channel structure CA, the gate contact portion 184, the source contact portion 186, the input and output connection wiring 188, or the like may be connected to the base bonding pad 162 through the contact via 168 rather than being directly connected to each other.

Alternatively, in a bonding memory portion 104, a contact via 168 may be disposed between a second channel structure CB and a first and/or second bonding pad 164 and/or 166, between a gate contact portion 184 and the first and/or second bonding pad 164 and/or 166, between a source contact portion 186 and the first and/or second bonding pad

164 and/or 166, between am input and output connection wiring 188 and the first and/or second bonding pad 164 and/or 166, or the like. That is, the second channel structure CB, the gate contact portion 184, the source contact portion 186, the input and output connection wiring 188, or the like may be connected to the first bonding pad 164 and/or the second bonding pad 166 through the contact via 168 rather than being directly connected with each other.

Accordingly, the base bonding pad 162, the first bonding pad 164, and/or the second bonding pad 166 can be formed through a more simple process.

Figure 6:
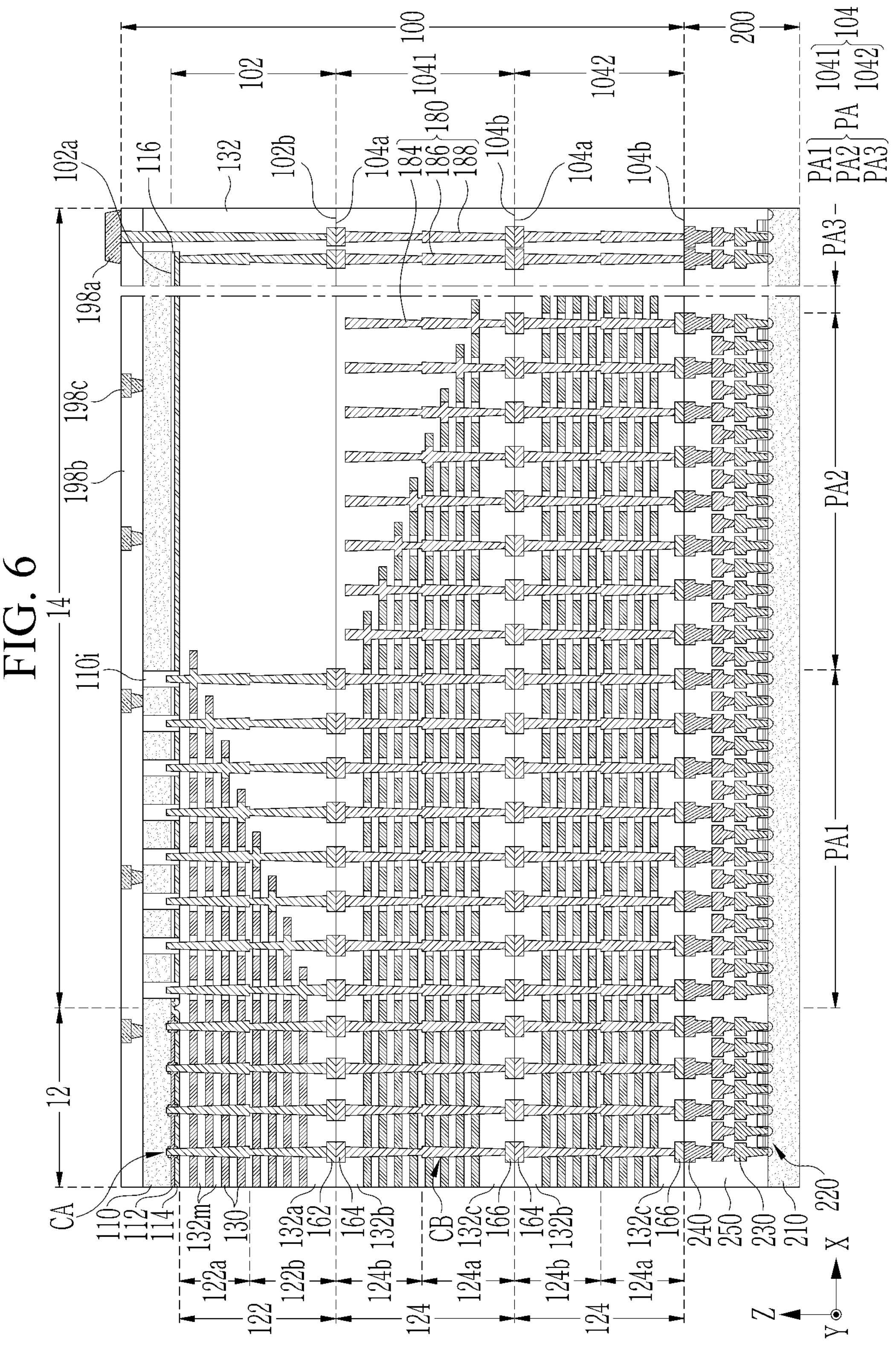
FIG. 6 is a schematic cross-sectional view of a semiconductor device according to another embodiment.
Figure 7:
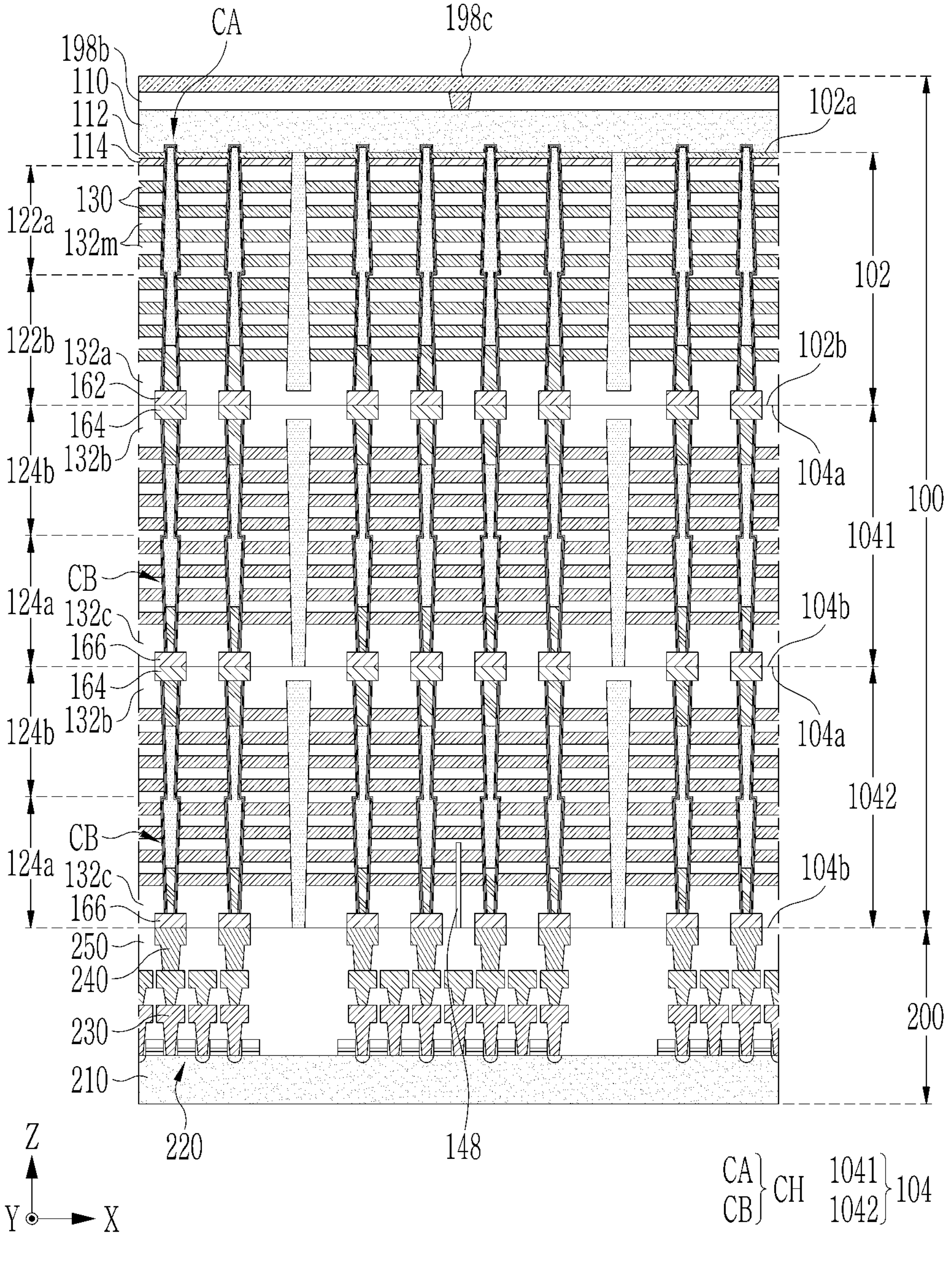
FIG. 7 is a cross-sectional view of a cell array region of the semiconductor device shown in FIG. 6.

FIG. 6 is a schematic cross-sectional view of a semiconductor device according to another embodiment, and FIG. 7 is a cross-sectional view of a cell array region of the semiconductor device shown in FIG. 6.

Referring to FIG. 6 and FIG. 7, in a semiconductor device according to another embodiment, a plurality of bonding memory portions 104 may be bonded to a base memory portion 102. That is, a plurality of bonding memory portions 104 are sequentially bonded to the other surface 102*b* of the base memory portion 102 to form a cell region 100. A second surface of the plurality of bonding memory portions 104 adjacent to a circuit region 200 may be bonded with one surface of the circuit region 200. Accordingly, a plurality of bonding memory portions 104, each having a normal structure, while being bonded to each other may be disposed between the circuit region 200 and a base memory portion 102 having an reverse structure.

Here, a first bonding pad 164 disposed at a first surface of the plurality of bonding memory portions 104 bonded to the other surface 102*b* of the base memory portion 102 may be bonded to a base bonding pad 162 of the base memory portion 102, and a second bonding pad 166 disposed on a second surface of the plurality of bonding memory portions 104 bonded to the circuit region 200 may be bonded to a first bonding structure 240 of the circuit region 200. The first or second bonding pad 164 or 166 disposed on a surface adjacent to a neighboring bonding memory portion 104 among the plurality of bonding memory portions 104 may be bonded to the second or first bonding pad 166 or 164 of the neighboring bonding memory portion 104.

For example, as shown in FIG. 6 and FIG. 7, when the plurality of bonding memory portion 104 include a first bonding memory portion 1041 and a second bonding memory portion 1042 that are sequentially disposed on the base memory portion 102, one surface 104*a* of the first bonding memory portion 1041 may form a first surface of the plurality of bonding memory portions 104 and the other surface 104*b* of the second bonding memory portion 1042 may form a second surface of the plurality of bonding memory portions 104. Accordingly, the first bonding pad 164 disposed on one surface 104*a* of the first bonding memory portion 1041 may be bonded to the base bonding pad 162, and the second bonding pad 166 disposed on the other surface 104*b* of the second bonding memory portion 1042 may be bonded to the first bonding structure 240. In addition, the second bonding pad 166 disposed on the other surface 104*b* of the first bonding memory portion 1041 and the first bonding pad 164 disposed on one surface 104*a* of the second bonding memory portion 1042 may be bonded to each other.

In a first pad region PA1, a plurality of gate contact portions 184 may be respectively connected to a plurality of gate electrodes 130 included in the base memory portion 102. In the first pad region PA1, a gate contact portion 184 connects a gate electrode 130 included in the base memory portion 102 to the circuit region 200 may be provided in each of the first bonding memory portion 1041 and the second bonding memory portion 1042. In the first pad region PA1, the gate contact portions 184 provided in the first bonding memory portion 1041 and the second bonding memory portion 1042 may be insulated from the gate electrodes 130.

In a second pad region PA2, a plurality of gate contact portions 184 may be respectively connected to a plurality of gate electrodes 130 included in the first bonding memory portion 1041. In the second bonding memory portion 1042 of the second pad region PA2, a gate contact portion 184 connecting the gate electrode 130 included in the first bonding memory portion 1041 to the circuit region 200 may be provided. In the second pad region PA2, the gate contact portion 184 provided in the second bonding memory portion 1042 may be insulated from the gate electrodes 130.

In a third pad region PA3, a plurality of gate electrodes 130 included in the second bonding memory portion 1042 may be respectively connected to the plurality of gate contact portions 184. However, the arrangement of the first to third pad regions PA1, PA2, and PA3 and the gate contact portions 184 are merely examples.

A manufacturing method of the semiconductor device 10 will be described with reference to FIG. 8A to FIG. 8E. FIG. 8A to FIG. 8E are cross-sectional views of an example of a manufacturing method of the semiconductor device shown in FIG. 6.

Figure 8A:
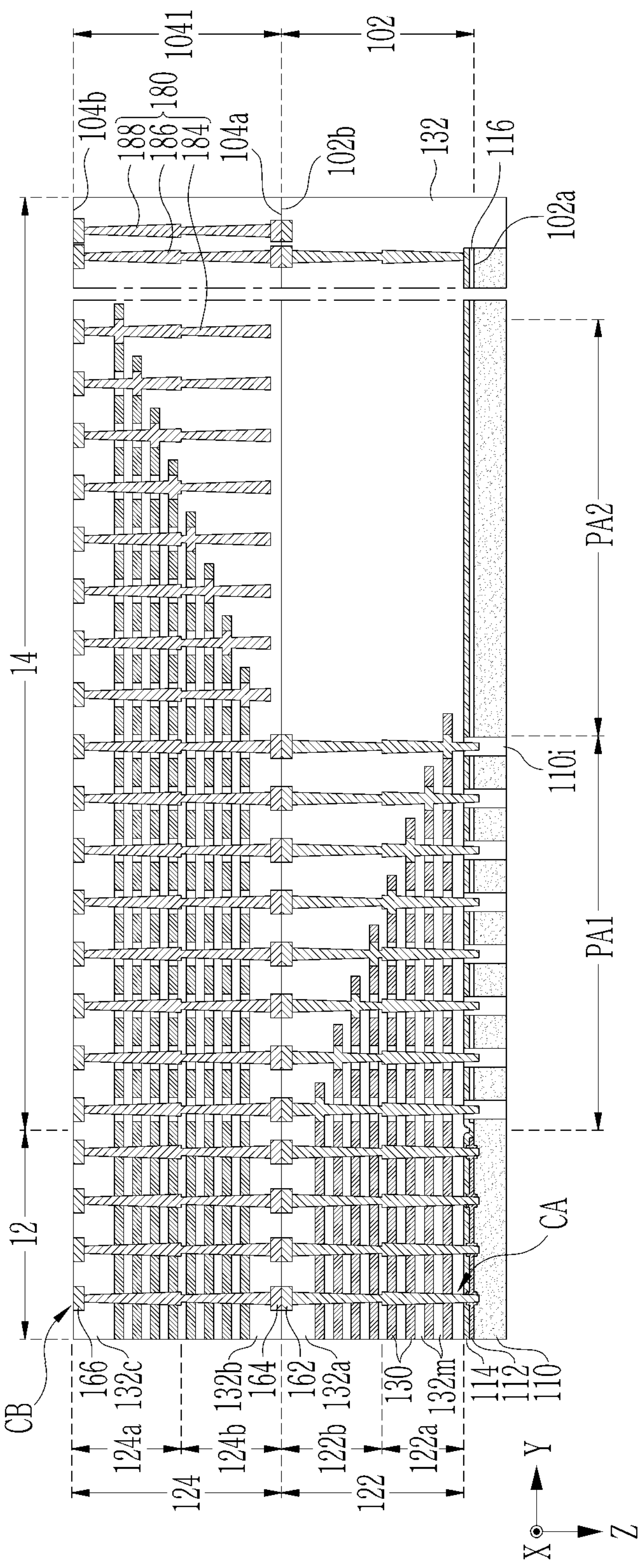
FIG. 8A to FIG. 8E are cross-sectional views of an example of a manufacturing method of the semiconductor device shown in FIG. 6.

As shown in FIG. 8A, a structure including a base memory portion 102 formed on a second substrate 110 and a bonding memory portion 104 (more specifically, a first bonding memory portion 1041) bonded to the base memory portion 102 may be formed. A process of forming the structure may be the same as a process described with reference to FIG. 4A to FIG. 4E.

Figure 8B:
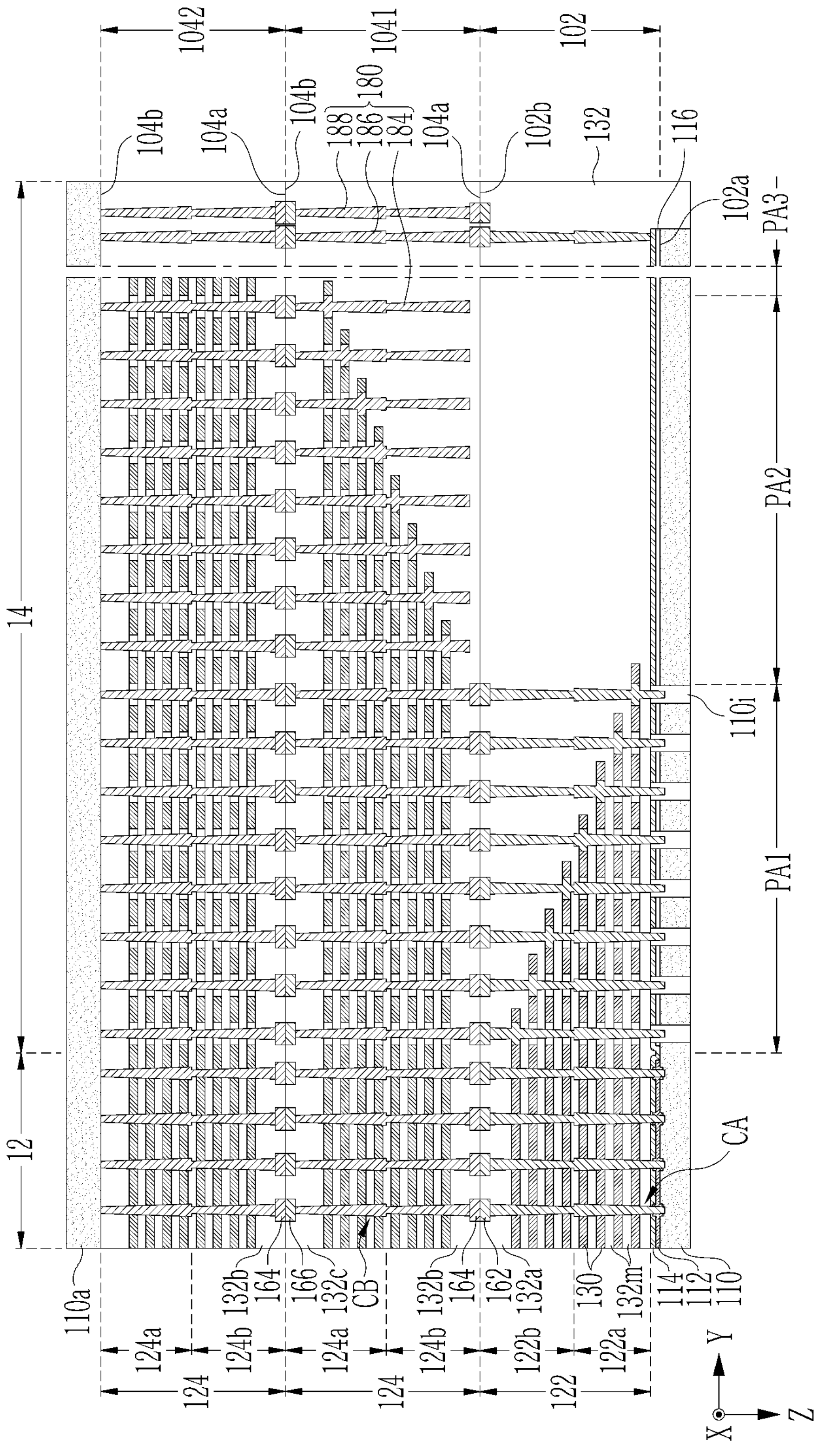

Subsequently, as shown in FIG. 8B, one surface 104*a* of a second bonding memory portion 1042 of another bonding memory substrate may be bonded onto the structure that includes the second substrate 110, the base memory portion 102, and the first bonding memory portion 1041. For example, the one surface 104*a* of the second bonding memory portion 1042 may be bonded onto the other surface 104*b* of the first bonding memory portion 1041. In a process of bonding the structure and the bonding memory substrate, the first bonding memory portion 1041 and the second bonding memory portion 1042 may be bonded with a reverse structure where an upper portion and a lower portion are reversed onto the base memory substrate disposed a normal structure.

The first bonding memory portion 1041 and the second bonding memory portion 1042 may be bonded by hybrid bonding including metal bonding and insulation layer bonding. A second bonding pad 166 provided on the other surface 104*b* of the first bonding memory portion 1041 and a first bonding pad 164 provided on one surface 104*a* of the second bonding memory portion 1042 may be bonded to each other, thereby forming metal bonding. A second insulation layer 132*c* provided on the other surface 104*b* of the first bonding memory portion 1041 and a first insulation layer 132*b* provided on one surface 104*a* of the second bonding memory portion 1042 may be bonded to each other, thereby forming insulation layer bonding.

Figure 8C:
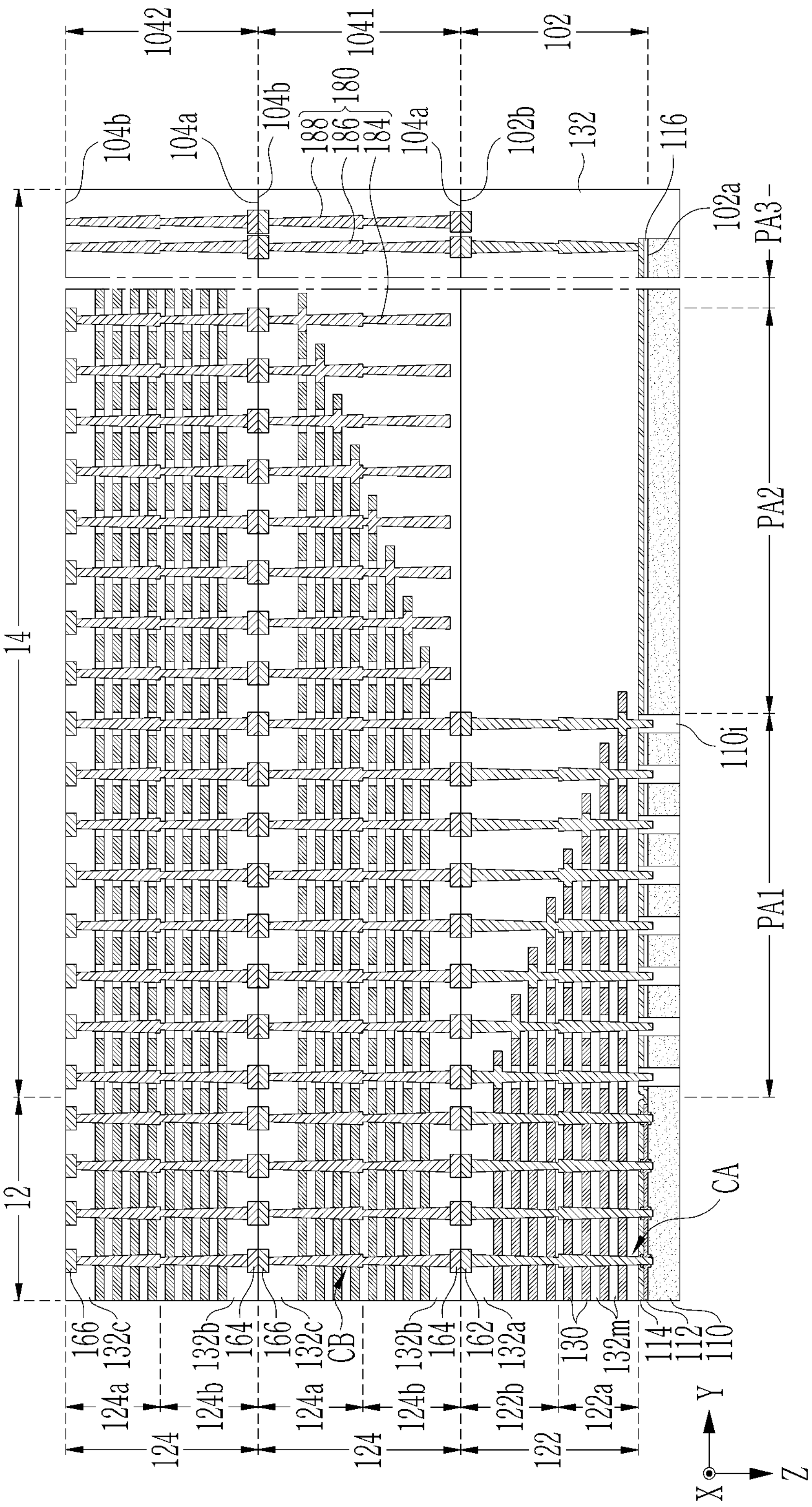

Subsequently, as shown in FIG. 8C, a carrier substrate 110*a* disposed on the other surface 104*b* of the second bonding memory portion 1042 may be removed, and a second channel pad (reference numeral 144*d* of FIG. 3, hereinafter the same) and a second bonding pad 166 may be formed to form another bonding memory portion 104 (more specifically, the second bonding memory portion 1042). A process of removing the carrier substrate 110*a* and forming the second channel pad 144*d* and the second bonding pad 166 may be the same as a process described with reference to FIG. 4C to FIG. 4E.

As described above, in the embodiment, in the forming the cell region 100, the plurality of bonding memory portion 104 are bonded on the base memory portion 102, and thus the cell region 100 may include one base memory portion 102 and the plurality of bonding memory portion 104.

Figure 8D:
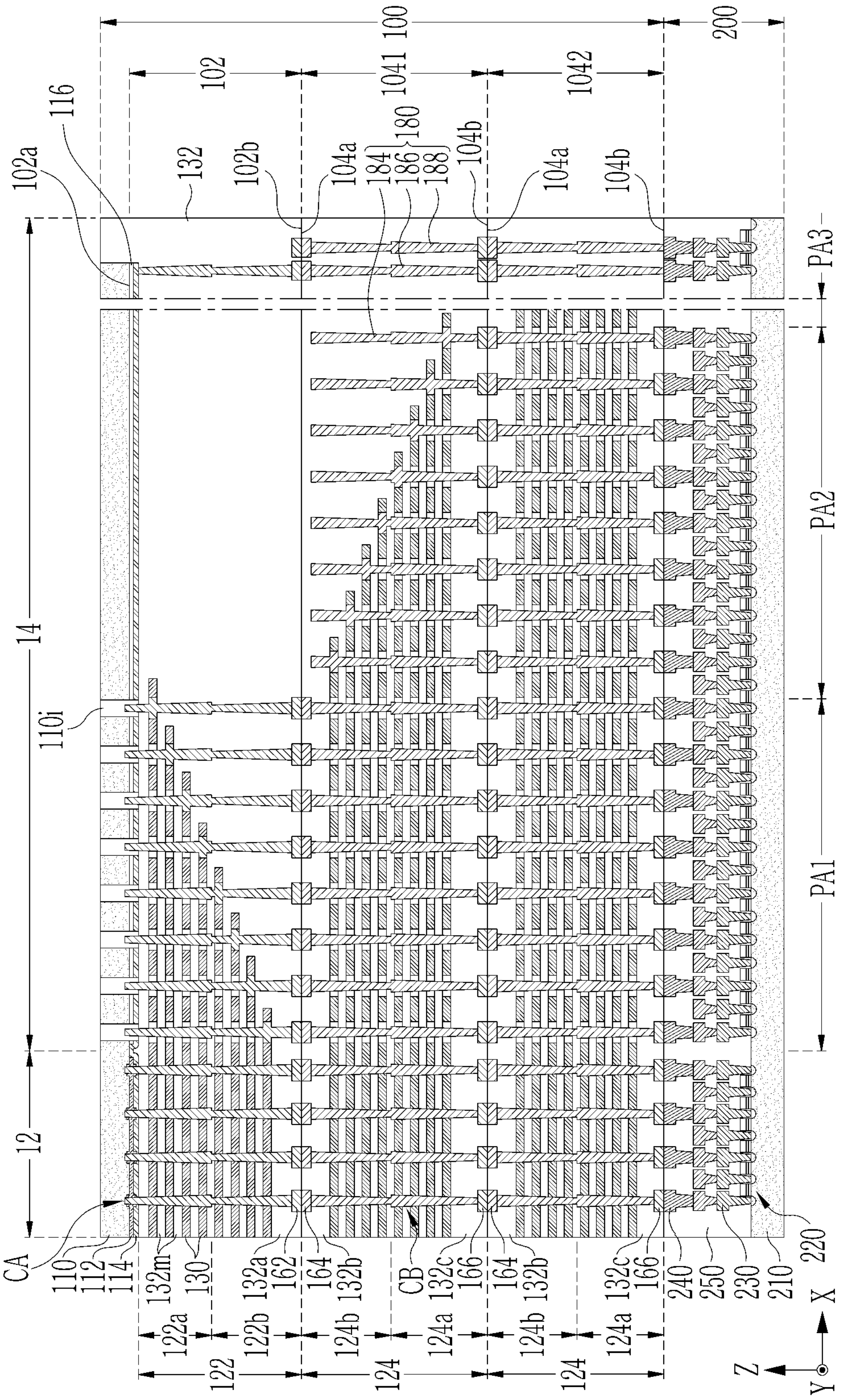

Subsequently, as shown in FIG. 8D, the cell region 100 may be bonded to the circuit region 200. In a bonding process of the cell region 100 and the circuit region 200, the cell region 100 shown in FIG. 8C may be bonded in a reverse or upside-down state where an upper portion and a lower portion are reversed to the circuit region 200. Accordingly, the base memory portion 102, which had a normal structure in the forming process of the cell region 100, may have a reverse structure in a final structure, and a plurality of bonding memory portions 104, which were bonded in a reverse structure in the forming process of the cell region 100, may have a normal structure in a final structure.

Although it is illustrated that two bonding memory portions 104 are provided in FIG. 6, FIG. 7, and FIG. 8A to FIG. 8E, three or more bonding memory portions 104 may be provided. A number of the plurality of bonding memory portions 104 may be adjusted by repeating the process of FIG. 8B and FIG. 8C.

Figure 8E:
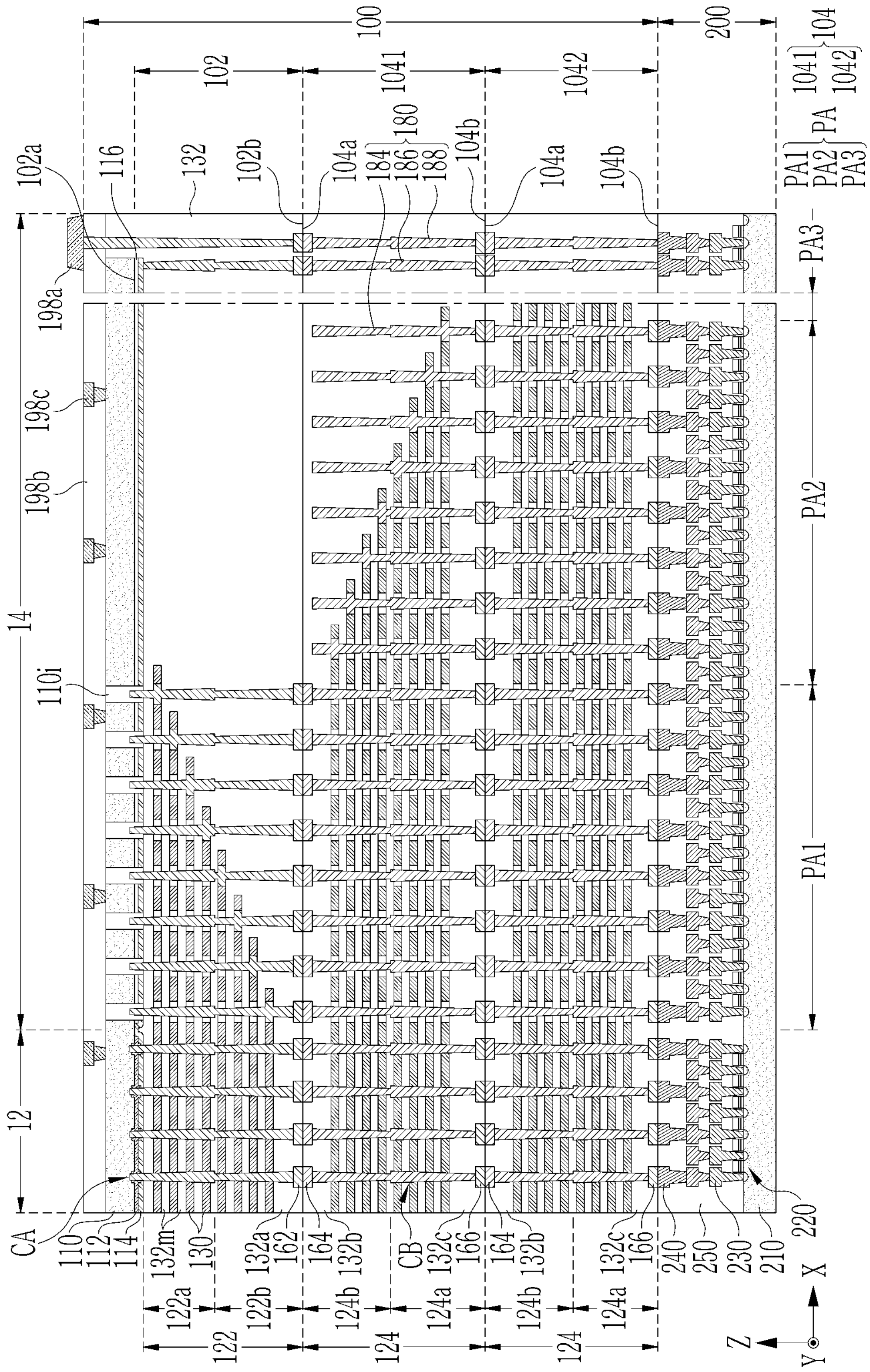

Subsequently, as shown in FIG. 8E, an input and output connection wiring 188, an input and output pad 198*a*, an insulation layer 198*b*, and a source connection pattern 198*c* may be formed to form the semiconductor device 10.

An example of an electronic system including the semiconductor device as described above will be described in detail.

Figure 9:
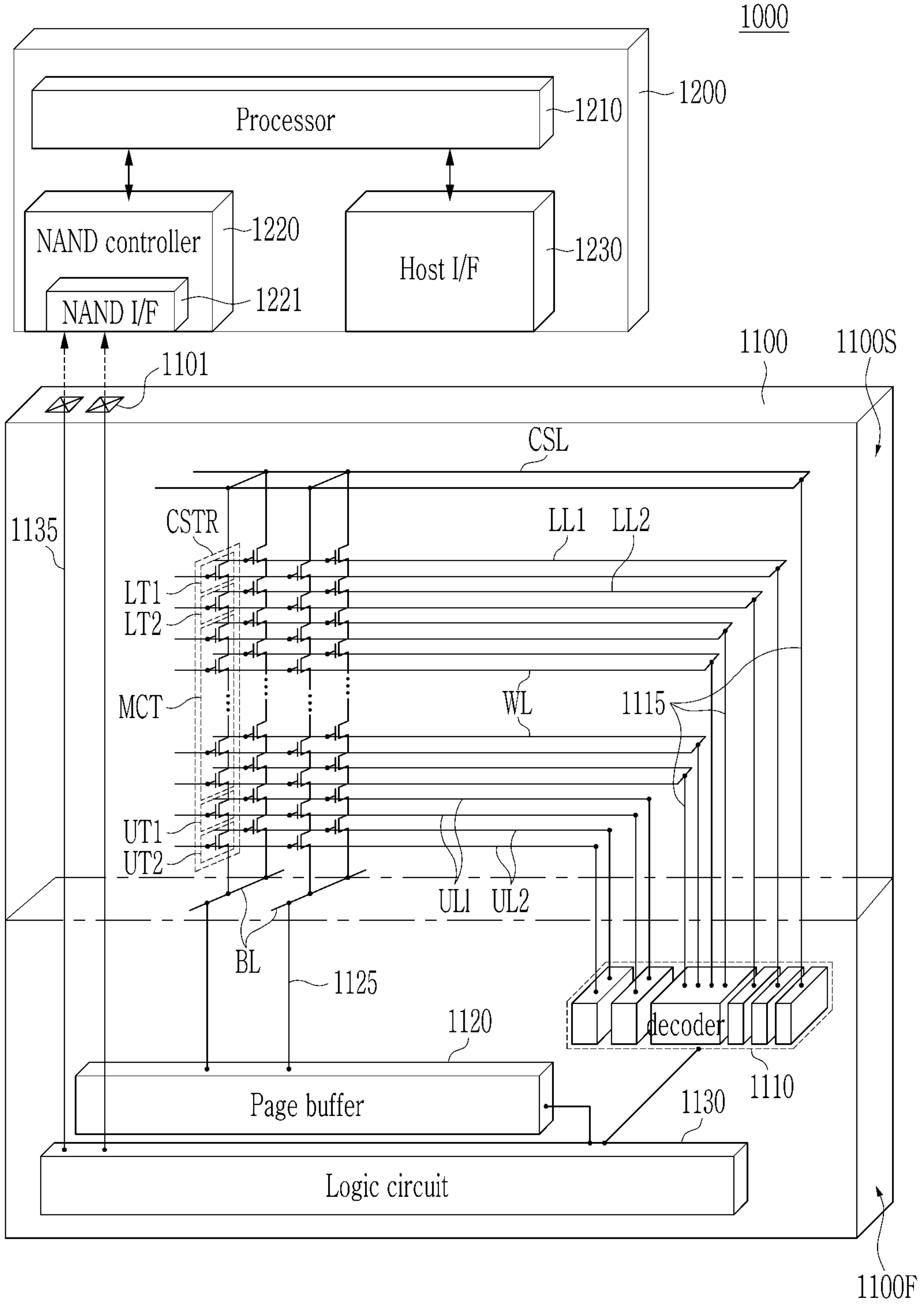
FIG. 9 schematically illustrates an electronic system including a semiconductor device according to an embodiment.

FIG. 9 schematically illustrates an electronic system including a semiconductor device according to an embodiment.

Referring to FIG. 9, an electronic system 1000 according to an embodiment may include a semiconductor device 1100 and a controller 1200 electrically connected with the semiconductor device 1100. The electronic system 1000 may be a storage device including one or a plurality of semiconductor devices 1100 or an electronic device including storage device. For example, the electronic system 1000 may be a solid-state drive device (SSD) including one or a plurality of semiconductor devices 1100, a universal serial bus (USB), a computing system, a medical device, or a communication device.

For example, the semiconductor device 1100 may be a non-volatile memory device, e.g., the NAND flash memory device described with reference to FIG. 1 to FIG. 3, and FIG. 5 to FIG. 7. The semiconductor device 1100 may include a first structure 1100F and a second structure 1100S on the first structure 1100F. In an embodiment, the first structure 1100F may be disposed next to second structure 1100S. The first structure 1100F may be a peripheral circuit structure including a decoder circuit 1110, a page buffer 1120, and a logic circuit 1130. The second structure 1100S may be a memory cell structure that includes a bit line BL, a common source line CSL, a word line WL, first and second gate upper lines UL1 and UL2, first and second gate lower lines LL1 and LL2, and a memory cell string CSTR between the bit line BL and the common source line CSL.

In the second structure 1100S, each of the memory cell strings CSTR has lower transistors LT1 and LT2 adjacent to the common source line CSL, upper transistors UT1 and UT2 adjacent to the bit line BL, and a plurality of memory cell transistors MCT disposed between the lower transistors LT1 and LT2 the upper transistors UT1 and UT2. The number of lower transistors LT1 and LT2 and the number of upper transistors UT1 and UT2 may be variously modified depending on embodiments.

In an embodiment, the lower transistors LT1 and LT2 may include a lower erase control transistor LT1 and ground select transistor LT2 that are connected in series. The upper transistors UT1 and UT2 may include a string select transistor UT1 and an upper erase control transistor UT2 connected in series. At least one of the lower erase control transistor LT1 and the upper erase control transistor UT2 may be used for erase operation to erase data stored in memory cell transistors MCT by using gate induced leakage (GIDL) phenomenon.

For simple illustration, in FIG. 9, the memory cell string CSTR is exemplarily illustrated as a portion corresponding to a part of a base memory portion (reference numeral 102 of FIG. 1, hereinafter the same) and a bonding memory portion (reference numeral 104 of FIG. 1, hereinafter the same).

In an embodiment, the upper and lower erase control transistors UT2 and LT1 may be provided on upper and lower portions of the base memory portion 102 and the bonding memory portion 104, respectively.

The common source line CSL, the first and second gate lower lines LL1 and LL2, the word line WL, and the first and second gate upper lines UL1 and UL2 may be electrically connected with a decoder circuit 1110 through a first connection wiring 1115 extending from first structure 1100F to the second structure 1100S. The bit line BL may be electrically connected to the page buffer 1120 through a second connection wiring 1125 extending from the first structure 1100F to the second structure 1100S.

In the first structure 1100F, the decoder circuit 1110 and the page buffer 1120 may perform control operation with respect to at least one selected from the plurality of memory cell transistors MCT. The decoder circuit 1110 and the page buffer 1120 may be controlled by a logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connection wiring 1135 extending from the first structure 1100F to the second structure 1100S.

The controller 1200 may include a processor 1210, a NAND controller 1220, and a host interface 1230. Depending on embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to predetermined firmware, and may access the semiconductor device 1100 by controlling the NAND controller 1220. The NAND controller 1220 may include a NAND interface 1221 that handles communication with the semiconductor device 1100. Control instructions for controlling the semiconductor device 1100, data to be written to the memory cell transistor MCT of the semiconductor device 1100, data to be read from the memory cell transistor MCT of the semiconductor device 1100, and the like may be transmitted through the NAND interface 1221. The host interface 1230 may provide a communication function between the electronic system 1000 and an external host. When a control instruction is received from an external host through the host interface 1230, the processor 1210 may control the semiconductor device 1100 in response to the control instruction.

Figure 10:
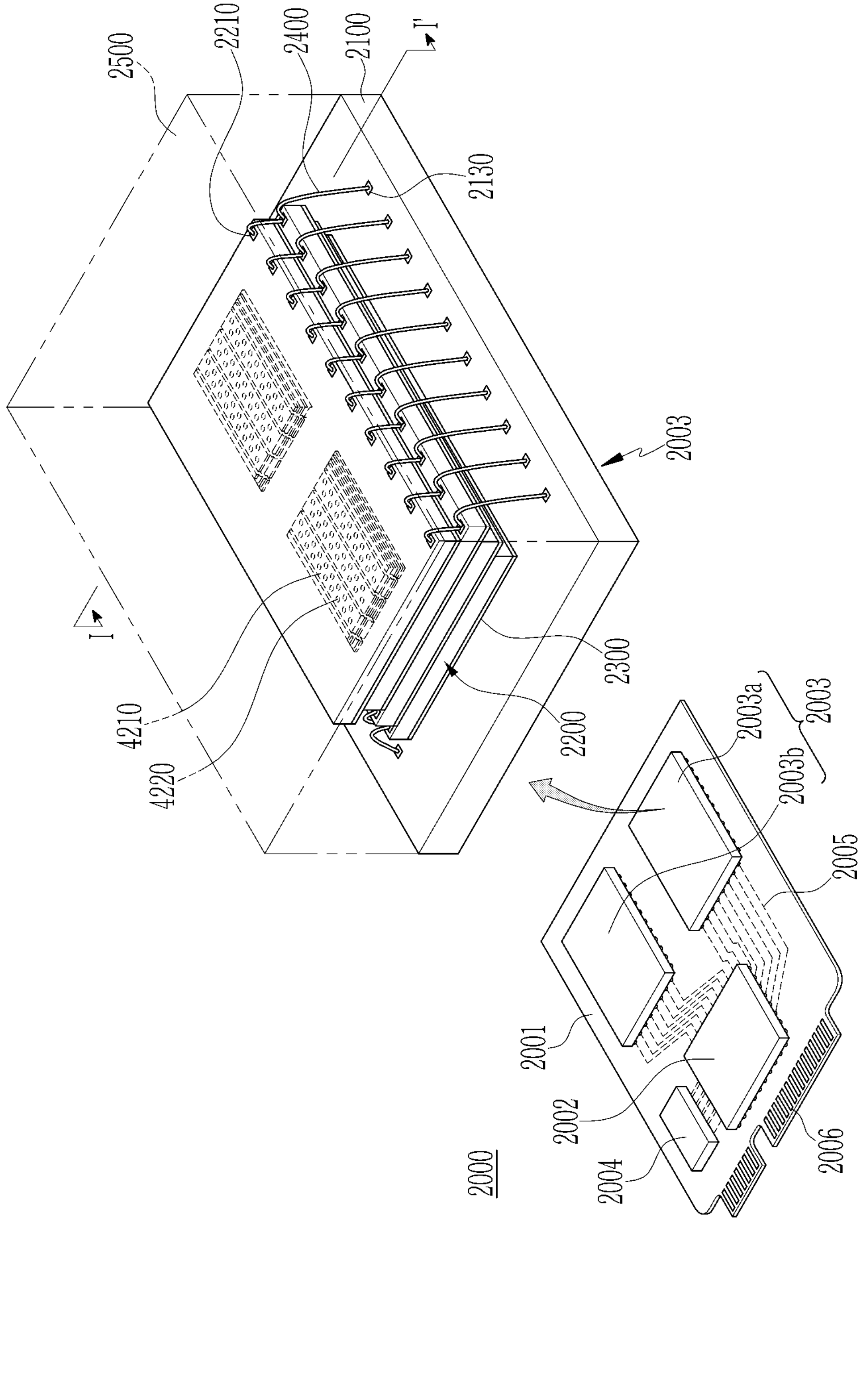
FIG. 10 schematic perspective view of an electronic system including a semiconductor device according to an embodiment.

FIG. 10 schematic perspective view of an electronic system including a semiconductor device according to an embodiment.

Referring to FIG. 10, an electronic system 2000 according to an embodiment may include a main substrate 2001, a controller 2002 mounted on the main substrate 2001, at least one semiconductor package 2003, and a DRAM 2004. The semiconductor package 2003 and the DRAM 2004 may be connected with the controller 2002 by a wiring pattern 2005 formed in the main substrate 2001.

The main substrate 2001 may include a connector 2006 including a plurality of pins coupled to an external host. The number of the plurality of pins in the connector 2006 may vary depending on a communication interface between the electronic system 2000 and the external host. In an embodiment, the electronic system 2000 may communicate with the external host according to any suitable interface, e.g., a universal serial bus (USB), a peripheral component interconnect express (PCI-Express), a serial advanced technology attachment (SATA), and M-Phy for a universal flash storage (UFS). In an embodiment, the electronic system 2000 may operate by power supplied from the external host through the connector 2006. The electronic system 2000 may further include a power management integrated circuit (PMIC) that distributes power supplied from the external host to the controller 2002 and the semiconductor package 2003.

The controller 2002 may write data to the semiconductor package 2003 or read data from the semiconductor package 2003, and may improve the operation speed of the electronic system 2000.

The DRAM 2004 may be a buffer memory for mitigating a speed difference between the semiconductor package 2003, which is a data storage space, and the external host. The DRAM 2004 included in the electronic system 2000 may also operate as a kind of cache memory, and may provide a space for temporarily storing data in a control operation for the semiconductor package 2003. When the electronic system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may be semiconductor packages each including a plurality of semiconductor chips 2200. Each of the first and second semiconductor packages 2003*a* and 2003*b* includes a package substrate 2100, a semiconductor chip 2200 on the package substrate 2100, an adhesive layer 2300 disposed on a bottom surface of each semiconductor chip 2200, a connection structure 2400 electrically connecting the semiconductor chip 2200 and the package substrate 2100, and a molding layer 2500 covering the semiconductor chip 2200 and the connection structure 2400 on the package substrate 2100.

The package substrate 2100 may be a printed circuit board including a package upper pad 2130. Each semiconductor chip 2200 may include an input and output pad 2210. The input and output pad 2210 may correspond to the input and output pad 1101 of FIG. 9. Each semiconductor chip 2200 may include a gate stacking structure 3210 and a channel structure 3220. The semiconductor chip 2200 may include the semiconductor device described with reference to FIG. 1 to FIG. 3, and FIG. 5 FIG. 7, respectively.

In an embodiment, the connection structure 2400 may be a bonding wire electrically connecting the input and output pad 2210 and the package upper pad 2130. Accordingly, in each of the first and second semiconductor packages 2003*a* and 2003*b*, the semiconductor chips 2200 may be electrically connected to each other by a bonding wire method, and may be electrically connected to the package upper pad 2130 of the package substrate 2100. Depending on embodiments, in each of the first and second semiconductor packages 2003*a* and 2003*b*, the semiconductor chips 2200 may be electrically connected to each other by a connection structure including a through silicon via (TSV) instead of the bonding wire type connection structure 2400.

In an embodiment, the controller 2002 and the semiconductor chip 2200 may be included in one package. For example, the controller 2002 and the semiconductor chip 2200 may be mounted on a separate interposer substrate that is different from the main substrate 2001, and the controller 2002 and the semiconductor chip 2200 may be connected to each other by wiring formed on the interposer substrate.

Figure 11:
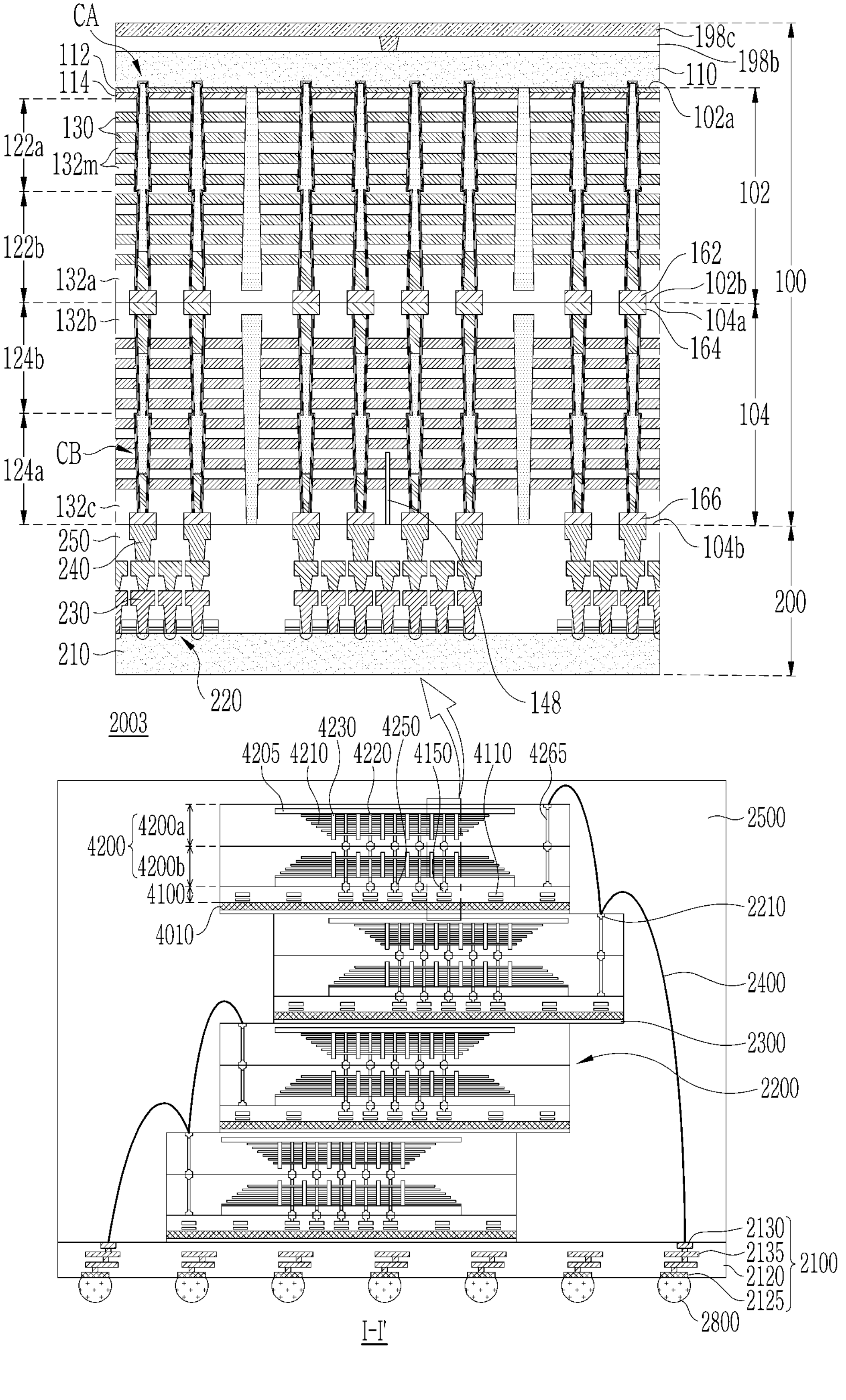
FIG. 11 is a schematic cross-sectional view of a semiconductor package according to an embodiment.

FIG. 11 is a schematic cross-sectional view of a semiconductor package according to an embodiment. FIG. 11 shows a region of the semiconductor package 2003 of FIG. 10, taken along the line I-I' for description of the semiconductor package 2003 of FIG. 10.

Referring to FIG. 11, in the semiconductor package 2003, the package substrate 2100 may be a printed circuit board. The package substrate 2100 may include a package substrate body 2120, a package upper pad 2130 disposed on an upper surface of the package substrate body 2120, a lower pad 2125 disposed on or exposed through a lower surface of the package substrate body 2120, and an internal wiring 2135 that electrically connects the upper pad 2130 and the lower pad 2125 in the package substrate body 2120. The upper pad 2130 may be electrically connected to the connection structure 2400. The lower pad 2125 may be connected to a wiring pattern 2005 of the main substrate 2010 of electronic system 2000 through a conductive connection portion 280 as shown in FIG. 10.

In the semiconductor package 2003, each semiconductor chip 2200 may include a semiconductor substrate 4010, a first structure 4100 on the semiconductor substrate 4010, and a second structure 4200 bonded with the first structure 4100 on the first structure 4100 by a wafer bonding method.

The first structure 4100 may include a peripheral circuit region including a peripheral wiring 4110 and a first bonding structure 4150. The second structure 4200 may include a common source line 4205, a gate stacking structure 4210 between the common source line 4205 and the first structure 4100, a channel structure 4220 and a separation structure 4230 passing through the gate stacking structure 4210, and a second bonding structure 4250 electrically connected to a word line (reference numeral WL of FIG. 9, hereinafter the same) of the channel structure 4220 and the gate stacking structure 4210. For example, the second bonding structure 4250 may be electrically connected to the channel structure 4220. The first bonding structure 4150 of the first structure 4100 and the second bonding structure 4250 of the second structure 4200 can be bonded while contacting each other. A bonded portion of the first bonding structure 4150 and the second bonding structure 4250 may be formed of, e.g., copper (Cu).

In an embodiment, the second structure 4200 includes a base memory portion 4200*a* and a bonding memory portion 4200*b* that are bonded to each other to effectively increase the number of memory cells, thereby improving performance and efficiency of the semiconductor device.

Each of the semiconductor chips 2200 may further include an input and output pad 2210 and input and output connection wiring 4265 under the input and output pad 2210. The input and output connection wiring 4265 may be electrically connected to some of the second bonding structure 4250.

In an embodiment, a plurality of semiconductor chips 2200 in the semiconductor package 2003 may be electrically connected to each other by a connection structure 2400 in the form of a bonding wire. As another example, the plurality of semiconductor chips 2200 or a plurality of portions constituting the plurality of semiconductor chips 2200 may be electrically connected by a connection structure including a through electrode.

By way of summation and review, an embodiment provides a semiconductor device that can improve performance and efficiency, a manufacturing method of the semiconductor device, and an electronic system including the semiconductor device. That is, according to an embodiment, in a bonding memory device in which the cell region and the circuit region are bonded, the cell region includes a base memory portion formed on the substrate and the bonding memory portion bonded thereto. In this case, after forming the base memory portion and the bonding memory portion separately to a limit of a manufacturing process, the base memory portion and the bonding memory portion may be bonded to form a cell region. Accordingly, a number of memory cells included in the cell region can be effectively increased regardless of a limit of a manufacturing process. Therefore, performance and efficiency of a semiconductor device can be improved with a simple process using hybrid bonding.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a circuit region and a cell region bonded on the circuit region, wherein the cell region includes:

a substrate, a base memory portion that includes a first gate stacking structure on the substrate and having a first surface facing the substrate and a second surface opposite to the substrate, a first channel structure penetrating the first gate stacking structure, and a base bonding pad on the second surface of the first gate stacking structure and connected to the first channel structure, and a bonding memory portion that includes a second gate stacking structure having a third surface bonded to the base memory portion and a fourth surface bonded to the circuit region, a second channel structure penetrating the second gate stacking structure, a first bonding pad connected to the second channel structure in the third surface of the second gate stacking structure and bonded to the base bonding pad, and a second bonding pad connected to the second channel structure in the fourth surface of the second gate stacking structure and bonded to the circuit region.

2. The semiconductor device as claimed in claim 1, wherein:

the base memory portion and the bonding memory portion are bonded by hybrid bonding, and the bonding memory portion and the circuit region are bonded by hybrid bonding.

3. The semiconductor device as claimed in claim 1, wherein:

the base bonding pad and the first bonding pad are in direct contact, and the second bonding pad and a bonding structure of the circuit region are in direct contact.

4. The semiconductor device as claimed in claim 1, wherein:

the base memory portion includes a base insulation layer at a periphery of the base bonding pad in the second surface of the first gate stacking structure, the second gate stacking structure includes a first insulation layer at a periphery of the first bonding pad in the third surface of the second gate stacking structure and a second insulation layer at a periphery of the second bonding pad in the fourth surface of the second gate stacking structure, the circuit region includes a third insulation layer at a periphery of a bonding structure, the base insulation layer and the first insulation layer are bonded to each other, and the third insulation layer and the second insulation layer are bonded to each other.

5. The semiconductor device as claimed in claim 1, wherein at least a part of one of the base bonding pad, the first bonding pad, and the second bonding pad is formed of a bit line.

6. The semiconductor device as claimed in claim 5, wherein the base bonding pad, the first bonding pad, the second bonding pad, or the bit line include copper.

7. The semiconductor device as claimed in claim 1, wherein each of the base memory portion and the bonding memory portion includes a gate induced drain leakage transistor.

8. The semiconductor device as claimed in claim 1, wherein:

the first channel structure includes a doping region that overlaps at least one of a plurality of gate electrodes included in the first gate stacking structure in a horizontal direction at the first surface of the first gate stacking structure, and the first channel structure includes a channel pad that overlaps at least one of the plurality of gate electrodes included in the first gate stacking structure in the horizontal direction at the second surface of the first gate stacking structure.

9. The semiconductor device as claimed in claim 8, wherein:

the first channel structure includes a channel layer, and the doping region is a layer continuously connected to the channel layer.

10. The semiconductor device as claimed in claim 1, wherein:

the second channel structure includes a first channel pad that overlaps at least one of a plurality of gate electrodes included in the second gate stacking structure in a horizontal direction at the third surface of the second gate stacking structure, and the second channel structure includes a second channel pad that overlaps at least one of the plurality of gate electrodes included in the second gate stacking structure in the horizontal direction at the fourth surface of the second gate stacking structure.

11. The semiconductor device as claimed in claim 1, wherein a structure of the bonding memory portion is inverted with respect to a structure of the base memory portion along a vertical direction.

12. The semiconductor device as claimed in claim 1, wherein:

the base memory portion includes one base memory portion, and the bonding memory portion includes a plurality of the bonding memory portion.

13. The semiconductor device as claimed in claim 1, wherein at least one of the first gate stacking structure and the second gate stacking structure includes a plurality of stacking structures.

14. The semiconductor device as claimed in claim 1, wherein:

the base bonding pad is directly connected to the first channel structure; or at least one of the first bonding pad and the second bonding pad is directly connected to the second channel structure.

15. The semiconductor device as claimed in claim 1, wherein:

the base bonding pad is connected to the first channel structure through a first contact via; or at least one of the first bonding pad and the second bonding pad is connected to the second channel structure through a second contact via.

16. The semiconductor device as claimed in claim 1, wherein:

the first gate stacking structure and the second gate stacking structure include a plurality of gate electrodes, and the semiconductor device further includes a gate contact portion penetrating the plurality of gate electrodes to be electrically connected to the circuit region, the gate contact portion being electrically connected to a connection gate electrode among the plurality of gate electrodes and insulated from remaining gate electrodes among the plurality of gate electrodes.

17. An electronic system, comprising:

a main substrate;

a semiconductor device on the main substrate; and a controller that is electrically connected with the semiconductor device on the main substrate, wherein the semiconductor device includes a circuit region and a cell region bonded to the circuit region, the cell region including:

a substrate, a base memory portion that includes a first gate stacking structure on the substrate and having a first surface facing the substrate and a second surface opposite to the substrate, a first channel structure penetrating the first gate stacking structure, and a base bonding pad disposed on the second surface of the first gate stacking structure and connected to the first channel structure, and a bonding memory portion that includes a second gate stacking structure having a third surface bonded to the base memory portion and a fourth surface bonded to the circuit region, a second channel structure penetrating the second gate stacking structure, a first bonding pad connected to the second channel structure in the third surface and bonded to the base bonding pad, and a second bonding pad connected to the second channel structure in the fourth surface and bonded to the circuit region.

* * * * *